(12) United States Patent
Yoon et al.

(10) Patent No.: US 12,232,352 B2
(45) Date of Patent: Feb. 18, 2025

(54) DISPLAY DEVICE

(71) Applicant: Samsung Display Co., Ltd., Yongin-si (KR)

(72) Inventors: Kwanhyuck Yoon, Yongin-si (KR); Seungyong Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 226 days.

(21) Appl. No.: 17/306,754

(22) Filed: May 3, 2021

(65) Prior Publication Data

US 2022/0029127 A1    Jan. 27, 2022

(30) Foreign Application Priority Data

Jul. 27, 2020   (KR) .................. 10-2020-0093031

(51) Int. Cl.
*H10K 50/844*    (2023.01)
*H10K 59/122*    (2023.01)
*H10K 102/00*    (2023.01)

(52) U.S. Cl.
CPC ......... *H10K 50/844* (2023.02); *H10K 59/122* (2023.02); *H10K 2102/351* (2023.02)

(58) Field of Classification Search
CPC ............... H10K 50/844; H10K 59/122; H10K 2102/351
See application file for complete search history.

(56) References Cited

U.S. PATENT DOCUMENTS

| | | |
|---|---|---|
| 7,148,367 B2 | 12/2006 | Itsuki |
| 9,048,459 B2 | 6/2015 | Cho et al. |
| 9,905,413 B2 | 2/2018 | Yamakoshi et al. |
| 10,158,098 B2 | 12/2018 | Chen et al. |
| 10,312,475 B2 | 6/2019 | Won et al. |
| 10,446,793 B2 | 10/2019 | Kim et al. |
| 10,553,630 B2 | 2/2020 | Iwasaki |
| 10,950,673 B2 | 3/2021 | Bae et al. |
| 2010/0221855 A1* | 9/2010 | Yamazaki ............ H10K 50/865 257/E51.022 |
| 2015/0147483 A1* | 5/2015 | Fukazawa ............ C23C 16/345 427/535 |

(Continued)

FOREIGN PATENT DOCUMENTS

| | | |
|---|---|---|
| JP | 2004-250431 A | 9/2004 |
| JP | 6224258 B2 | 11/2017 |

(Continued)

*Primary Examiner* — Shaun M Campbell
(74) *Attorney, Agent, or Firm* — Lewis Roca Rothgerber Christie LLP

(57) ABSTRACT

A display device includes: a substrate; a display element on the substrate; a thin-film encapsulation layer on the display element, the thin-film encapsulation layer including at least one inorganic layer and at least one organic layer; and a lower layer below the thin-film encapsulation layer, the lower layer including a first surface parallel to an upper surface of the substrate and a second surface extending in a direction crossing the upper surface of the substrate. The at least one inorganic layer is has a first thickness on the first surface of the lower layer and a second thickness on the second surface of the lower layer, the first thickness is greater than or equal to the second thickness, and a ratio of the second thickness to the first thickness is about 0.51 or more.

13 Claims, 11 Drawing Sheets

(56) References Cited

U.S. PATENT DOCUMENTS

| | | | |
|---|---|---|---|
| 2016/0064461 A1* | 3/2016 | Lee | H10K 59/122 |
| | | | 257/40 |
| 2017/0025486 A1* | 1/2017 | Kwon | H10K 50/8428 |
| 2018/0076417 A1* | 3/2018 | Song | H10K 50/844 |
| 2018/0226610 A1* | 8/2018 | Moon | H10K 50/844 |
| 2019/0095007 A1* | 3/2019 | Jeong | H10K 59/131 |
| 2019/0326359 A1* | 10/2019 | Yang | H01L 27/124 |
| 2020/0127233 A1* | 4/2020 | Sung | H10K 77/111 |
| 2020/0176709 A1* | 6/2020 | Moon | H10K 50/844 |

FOREIGN PATENT DOCUMENTS

| | | |
|---|---|---|
| KR | 10-2016-0052540 A | 5/2016 |
| KR | 10-2018-0039801 A | 4/2018 |
| KR | 10-2019-0071295 A | 6/2019 |
| KR | 10-2019-0130705 A | 11/2019 |
| KR | 10-2019-0137205 A | 12/2019 |
| KR | 10-2019-0141032 A | 12/2019 |

\* cited by examiner

DISPLAY DEVICE

CROSS-REFERENCE TO RELATED APPLICATION

This application claims priority to and the benefit of Korean Patent Application No. 10-2020-0093031, filed on Jul. 27, 2020, in the Korean Intellectual Property Office, the entire content of which is incorporated by reference herein.

BACKGROUND

1. Field

One or more embodiments or the present disclosure relate to a display device including a thin-film encapsulation layer.

2. Description of Related Art

As the information society has developed, the demand for display devices that display images in various forms has increased. Display devices have rapidly changed from bulky cathode ray tubes (CRTs) to slim, lightweight, and large-scale flat panel displays (FPDs). Examples of FPDs include a liquid crystal display (LCD), a plasma display panel (PDP), an organic light-emitting display (OLED), and an electrophoretic display (EPD).

Display devices may include a thin-film encapsulation layer on a display layer that allow an image to be displayed, and the thin-film encapsulation layer may include at least one inorganic layer and at least one organic layer.

SUMMARY

One or more embodiments include a display device having improved reliability.

Additional aspects of embodiments will be set forth in part in the description which follows and, in part, will be apparent from the description, or may be learned by practice of the presented embodiments of the disclosure.

According to one or more embodiments, a display device includes a substrate, a display element on the substrate, a thin-film encapsulation layer on the display element, the thin-film encapsulation layer including at least one inorganic layer and at least one organic layer, and a lower layer below the thin-film encapsulation layer, the lower layer including a first surface parallel to an upper surface of the substrate and a second surface extending in a direction crossing the upper surface of the substrate, wherein the at least one inorganic layer has a first thickness on the first surface of the lower layer and a second thickness on the second surface of the lower layer, the first thickness is greater than or equal to the second thickness, and a ratio of the second thickness to the first thickness is about 0.51 or more.

In an embodiment, the ratio of the second thickness to the first thickness may be about 0.76 or more.

In an embodiment, an angle between the first surface and the second surface of the lower layer may be about 42° or more.

In an embodiment, the at least one inorganic layer may include $Si_xO_yN_z$, a composition ratio (Y/X) of oxygen to silicon in the at least one inorganic layer ($Si_xO_yN_z$) may be greater than about 0.5, and a composition ratio (Z/X) of nitrogen to silicon in the at least one inorganic layer ($Si_xO_yN_z$) may be less than or equal to about 0.5.

In an embodiment, the thin-film encapsulation layer may include a first inorganic layer, an organic layer, and a second inorganic layer, which are sequentially stacked, the first inorganic layer may be arranged along the first surface and the second surface of the lower layer, and a thickness of the second inorganic layer may be less than a thickness of the first inorganic layer.

In an embodiment, a water vapor transmission rate (WVTR) of the second inorganic layer may be less than a WVTR of the first inorganic layer.

In an embodiment, the first inorganic layer may include silicon oxynitride (SiON), and the second inorganic layer may include silicon nitride ($SiN_x$).

In an embodiment, the display element may include a pixel electrode, the lower layer may include a pixel defining layer covering an edge of the pixel electrode and having an opening exposing a central portion of the pixel electrode, and the second surface of the lower layer may define an inner surface of the opening.

In an embodiment, the display element may include a pixel electrode, the display device may further include a pixel defining layer covering an edge of the pixel electrode and having an opening exposing a central portion of the pixel electrode, and the lower layer may be above the pixel defining layer.

In an embodiment, the display element may include a pixel electrode, the display device may further include a pixel defining layer covering an edge of the pixel electrode and having an opening exposing a central portion of the pixel electrode, and a spacer above the pixel defining layer, and the lower layer may be above the spacer.

According to one or more embodiments, a display device includes a substrate, a display element on the substrate, a thin-film encapsulation layer on the display element, the thin-film encapsulation layer including a first inorganic layer, an organic layer, and a second inorganic layer, which are sequentially stacked, and a lower layer below the first inorganic layer, the lower layer including a first surface parallel to an upper surface of the substrate and a second surface extending in a direction crossing the upper surface of the substrate, wherein the first inorganic layer has a first thickness on the first surface of the lower layer and a second thickness on the second surface of the lower layer, the first thickness is greater than or equal to a thickness of the second inorganic layer, and a ratio of the second thickness to the first thickness is about 0.51 or more.

In an embodiment, the ratio of the second thickness to the first thickness may be about 0.76 or more.

In an embodiment, an angle between the first surface and the second surface of the lower layer may be about 42° or more.

In an embodiment, the first inorganic layer may include $Si_xO_yN_z$, a composition ratio (Y/X) of oxygen to silicon in the first inorganic layer ($Si_xO_yN_z$) may be greater than about 0.5, and a composition ratio (Z/X) of nitrogen to silicon in the first inorganic layer ($Si_xO_yN_z$) may be less than or equal to about 0.5.

In an embodiment, a water vapor transmission rate (WVTR) of the second inorganic layer may be less than a WVTR of the first inorganic layer.

In an embodiment, a refractive index of the second inorganic layer may be greater than a refractive index of the first inorganic layer.

In an embodiment, the display element may include a pixel electrode, the lower layer may include a pixel defining layer covering an edge of the pixel electrode and having an opening exposing a central portion of the pixel electrode, and the second surface of the lower layer may define the opening.

In an embodiment, the display element may include a pixel electrode, the display device may further include a pixel defining layer covering an edge of the pixel electrode and having an opening exposing a central portion of the pixel electrode, and the lower layer may be above the pixel defining layer.

In an embodiment, the display element may include a pixel electrode, the display device may further include a pixel defining layer covering an edge of the pixel electrode and having an opening exposing a central portion of the pixel electrode, and a spacer above the pixel defining layer, and the lower layer may be above the spacer.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
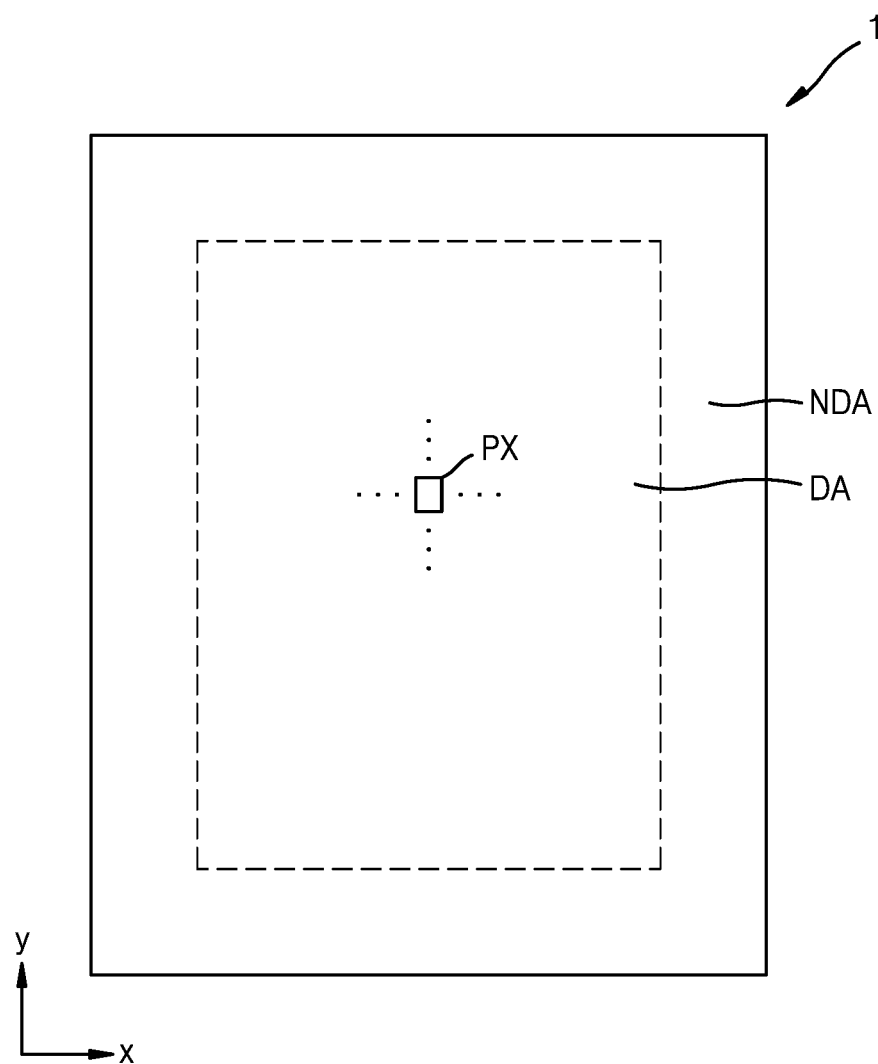
FIG. 1 is a schematic plan view of a display device according to an embodiment.

Reference will now be made in more detail to embodiments of the present disclosure, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, particular embodiments are illustrated in the drawings and are described in the detailed description. An effect and a characteristic of the disclosure, and a method of accomplishing these will be apparent when referring to embodiments described with reference to the drawings. The subject matter of this disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are identified with the same reference numeral regardless of the figure number, and redundant explanations are not repeated unnecessarily.

It will be understood that although the terms "first," "second," etc. may be used herein to describe various elements, these elements should not be limited by these terms. These terms are only used to distinguish one element from another.

An expression used in the singular encompasses the expression of the plural, unless it has a clearly different meaning in the context.

It will be further understood that the terms "comprises" and/or "comprising," as used herein, specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. For example, intervening layers, regions, or elements may be present.

Sizes of elements in the drawings may be exaggerated for convenience of explanation. In other words, because sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the following embodiments, it will be understood that when a layer, region, or element is referred to as being "connected to" or "coupled to" another layer, region, or element, it may be directly or indirectly connected or coupled to the other layer, region, or element. For example, intervening layers, regions, or elements may be present. In the following embodiments, it will be understood that when a layer, region, or element is referred to as being "electrically connected to" or "electrically coupled to" another layer, region, and element, it may be directly or indirectly electrically connected or coupled to the other layer, region, or element. For example, intervening layers, regions, or elements may be present.

A display device displays an image and may include a game console, a multimedia device, or a portable mobile device such as an ultra-small personal computer (PC). A display device may include a liquid crystal display, an electrophoretic display, an organic light-emitting display, an inorganic light-emitting display, a field emission display, a surface-conduction electron-emitter display, a quantum dot display, a plasma display, a cathode ray display, and/or the like. Hereinafter, an organic light-emitting display device is described as an example of a display device according to an embodiment, but the various other types of display devices described above may be used in embodiments.

Figure 2:
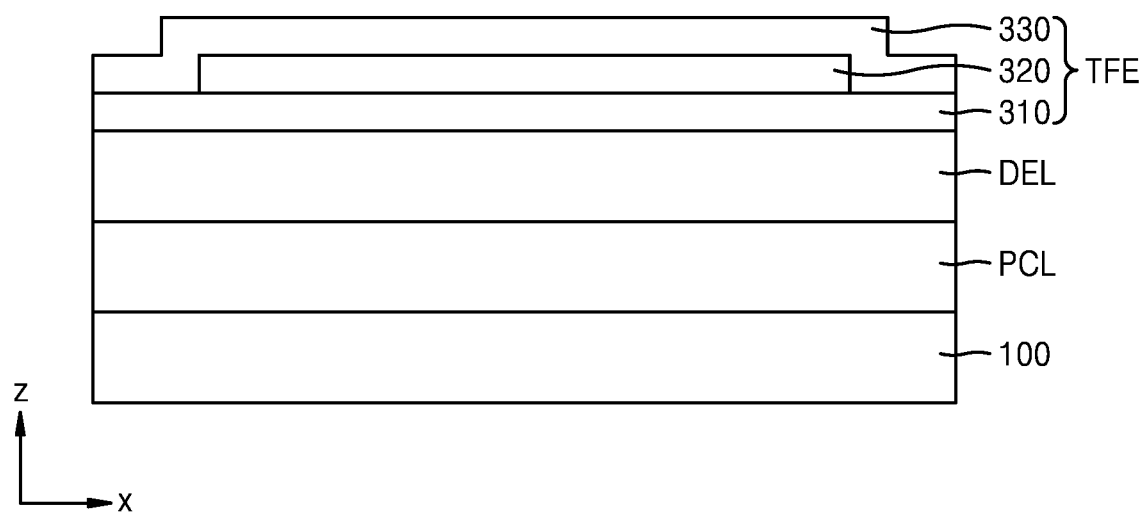
FIG. 2 is a schematic cross-sectional view of a display device according to an embodiment.

FIG. 1 is a schematic plan view of a display device 1 according to an embodiment. FIG. 2 is a schematic cross-sectional view of a display device according to an embodiment.

Referring to FIG. 1, the display device 1 may include a display area DA in which an image is displayed and a non-display area NDA in which no image is implemented. The display device 1 may provide images by using light emitted from a plurality of pixels PX in the display area DA. In an embodiment, each of the pixels PX may emit light by using a display element, for example, an organic light-emitting diode. In an embodiment, each of the pixels PX may emit red light, green light, or blue light. In an embodiment, each of the pixels PX may emit red light, green light, blue light, or white light.

Referring to FIG. 2, the display device may include a substrate 100, a pixel circuit layer PCL, a display element layer DEL, and a thin-film encapsulation layer TFE.

The substrate 100 may include glass and/or a polymer resin, such as polyethersulfone, polyacrylate, polyetherimide, polyethylene naphthalate, polyethylene terephthalate, polyphenylene sulfide, polyimide, polycarbonate, cellulose triacetate, and/or cellulose acetate propionate. The substrate 100 including the polymer resin may be flexible, rollable, and/or bendable. The substrate 100 may have a multilayer structure including a base layer including the above-described polymer resin and a barrier layer.

The pixel circuit layer PCL may be on the substrate 100. The display element layer DEL may include display elements, for example, organic light-emitting diodes. The pixel circuit layer PCL may include pixel circuits and insulating layers coupled to the organic light-emitting diodes. The pixel circuit layer PCL may include a plurality of thin-film transistors, storage capacitors, and insulating layers therebetween.

A barrier layer may be further included between the pixel circuit layer PCL and the substrate 100. The barrier layer prevents or reduces penetration of external foreign matter and may include a single layer or multiple layers including an inorganic material such as silicon nitride ($SiN_x$) and/or silicon oxide ($SiO_x$).

The thin-film encapsulation layer TFE may be on the display element layer DEL. The thin-film encapsulation layer TFE may be on the display element and cover the display element. The thin-film encapsulation layer TFE may include at least one inorganic layer and at least one organic layer. The at least one inorganic layer may include at least one inorganic material selected from aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic layer may include a polymer-based material. Examples of the polymer-based material may include an acrylic resin, an epoxy resin, polyimide, and/or polyethylene. In an embodiment, the at least one organic layer may include acrylate.

In an embodiment, the thin-film encapsulation layer TFE may include a first inorganic layer 310, an organic layer 320, and a second inorganic layer 330, which are sequentially stacked. In an embodiment, the light transmittance of at least one of the first inorganic layer 310 and the second inorganic layer 330 may be about 90% or more. In an embodiment, the first inorganic layer 310 may include silicon oxynitride (SiON). The second inorganic layer 330 may include silicon nitride ($SiN_x$). This may be for improving the reliability of the display device 1.

Figure 3A:
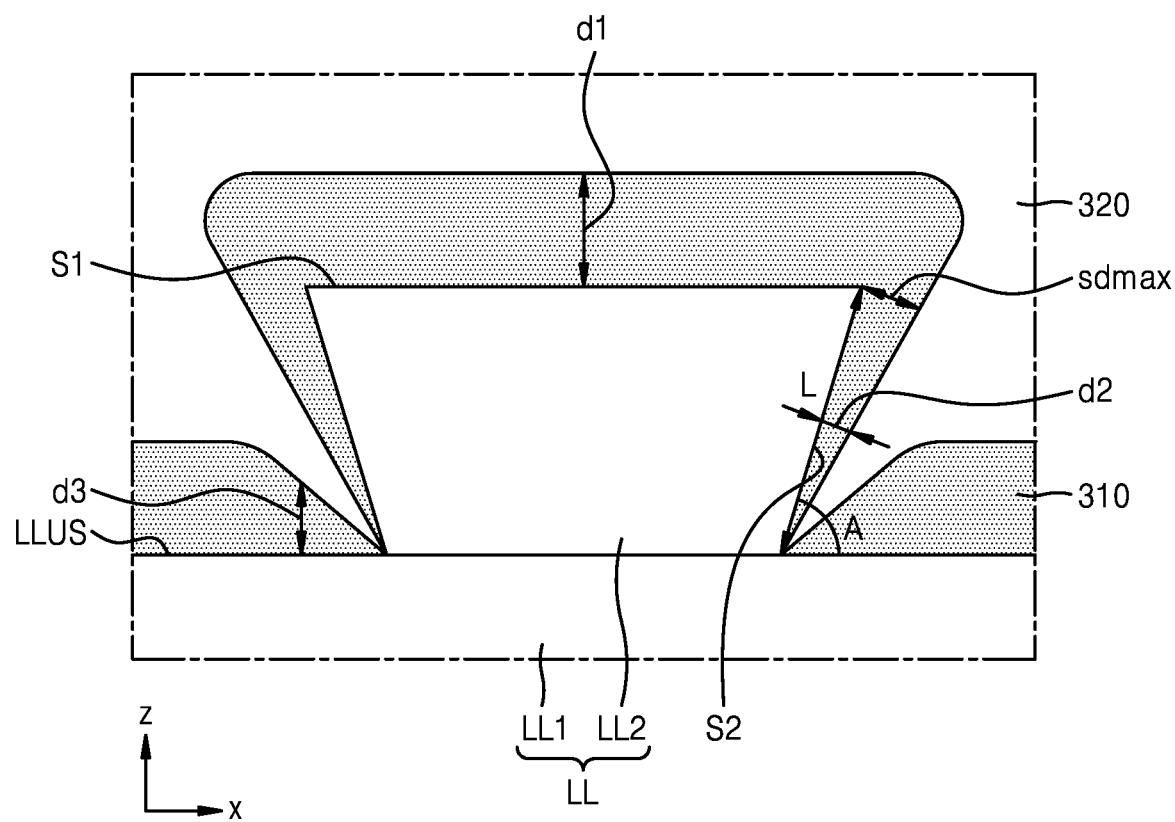
FIG. 3A is a schematic cross-sectional view of a portion of a display device, according to an embodiment.

FIG. 3A is a schematic cross-sectional view of a portion of a display device, according to an embodiment. In FIG. 3A, the same reference numerals as those in FIG. 2 refer to the same members, and redundant descriptions thereof will not be repeated here.

Referring to FIG. 3A, the display device may include a substrate, a display element, a thin-film encapsulation layer, and a lower layer LL. The thin-film encapsulation layer may include at least one inorganic layer and at least one organic layer. In an embodiment, the thin-film encapsulation layer may include a first inorganic layer 310, an organic layer 320, and a second inorganic layer.

The lower layer LL may be below the thin-film encapsulation layer. For example, the lower layer LL may be below the first inorganic layer 310. In this case, the first inorganic layer 310 may be arranged along the shape of the lower layer LL. In an embodiment, the lower layer LL may include a pixel defining layer of a display element layer to be described below. In an embodiment, the lower layer LL may include a spacer of the display element layer to be further described below. In an embodiment, the lower layer LL may include a pattern layer on the spacer of the display element layer to be further described below. The lower layer LL may include a first lower layer LL1 and a second lower layer LL2.

The first lower layer LL1 may include a flat upper surface LLUS. In this case, the upper surface LLUS of the first lower layer LL1 may be parallel (e.g., substantially parallel) to the upper surface of the substrate. The second lower layer LL2 may be on the first lower layer LL1. In an embodiment, the second lower layer LL2 may be integrally formed with the first lower layer LL1. In this case, the second lower layer LL2 may protrude from the first lower layer LL1. In another embodiment, the second lower layer LL2 may be a layer different layer from the first lower layer LL1. In this case, the second lower layer LL2 may include a material different from that of the first lower layer LL1.

The second lower layer LL2 may include a first surface S1 and a second surface S2. The first surface S1 of the second lower layer LL2 may be parallel (e.g., substantially parallel) to the upper surface of the substrate. In an embodiment, the first surface S1 of the second lower layer LL2 may be parallel (e.g., substantially parallel) to the upper surface LLUS of the first lower layer LL1. For example, the first surface S1 of the second lower layer LL2 may extend in an x direction. In some embodiments, the first surface S1 of the second lower layer LL2 may meet the second surface S2 of the second lower layer LL2 and cross (e.g., intersect with) the second surface S2 of the second lower layer LL2. The following description will focus on a case in which the first surface S1 of the second lower layer LL2 is parallel (e.g., substantially parallel) to the upper surface of the substrate, but the present disclosure is not limited thereto.

In an embodiment, the second lower layer LL2 may include an inclined second surface S2. The second surface S2 of the second lower layer LL2 may extend in a direction crossing (e.g., intersecting with) the upper surface of the substrate. For example, the second surface S2 of the second lower layer LL2 may extend in a direction crossing (e.g., intersecting with) the first surface S1 of the second lower layer LL2. For example, the second surface S2 of the second lower layer LL2 may extend in a direction crossing (e.g., intersecting with) the x direction.

The second surface S2 of the second lower layer LL2 may have a taper length L. The taper length L may be defined as a distance from a point at which the second surface S2 of the second lower layer LL2 and the upper surface LLUS of the first lower layer LL1 meet to a point at which the second surface S2 of the second lower layer LL2 and the first surface S1 of the second lower layer LL2 meets.

The first surface S1 and the second surface S2 of the second lower layer LL2 may form an angle A therebetween. In an embodiment, the angle A between the first surface S1 and the second surface S2 of the second lower layer LL2 may be an acute angle. In another embodiment, the angle A between the first surface S1 and the second surface S2 of the second lower layer LL2 may be a right angle. In another embodiment, the angle A between the first surface S1 and the second surface S2 of the second lower layer LL2 may be an obtuse angle. Because the first surface S1 of the second lower layer LL2 extends in a direction parallel (e.g., substantially parallel) to the upper surface of the substrate, the angle A may be defined as an angle between the second surface S2 of the second lower layer LL2 and the upper surface of the substrate. In some embodiments, the angle A may be defined as an angle between the upper surface LLUS of the first lower layer LL1 and the second surface S2 of the second lower layer LL2. FIG. 3A illustrates a case in which the angle A is an acute angle.

The first inorganic layer 310 may cover the first lower layer LL1 and the second lower layer LL2. Also, the organic layer 320 may be on the first inorganic layer 310. The first inorganic layer 310 may be on the upper surface LLUS of the first lower layer LL1 and the first surface S1 of the second lower layer LL2. In some embodiments, the first inorganic layer 310 in the first lower layer LL1 and the first inorganic layer 310 in the second lower layer LL2 may be coupled to each other. In this case, the first inorganic layer 310 in the first lower layer LL1 and the first inorganic layer 310 in the second lower layer LL2 may be integrally formed with each other.

The first inorganic layer 310 may have a first thickness d1 on the first surface S1 of the second lower layer LL2. The first thickness d1 may be defined as the length of the first inorganic layer 310 in a direction perpendicular (e.g., substantially perpendicular) to the first surface S1 of the second lower layer LL2. In some embodiments, the first thickness d1 may be defined as the length of the first inorganic layer 310 in a direction perpendicular (e.g., substantially perpendicular) to the upper surface of the substrate.

The first inorganic layer 310 may be on the second surface S2 of the second lower layer LL2. In an embodiment, because the first inorganic layer 310 is formed by chemical vapor deposition (CVD), the first inorganic layer 310 may also be formed on the second surface S2 of the second lower layer LL2 extending in a direction crossing (e.g., intersecting with) the first surface S1 of the second lower layer LL2.

The thickness of the first inorganic layer 310 on the second surface S2 of the second lower layer LL2 may decrease as the distance to the first lower layer LL1 decreases. The first inorganic layer 310 may be formed by CVD. In this case, the amount of gas forming the first inorganic layer 310 may not be suitable or sufficient as the distance to the first lower layer LL1 decreases. For example, the gas forming the first inorganic layer 310 may not be supplied suitably or enough to form the first thickness d1 at a point at which the upper surface LLUS of the first lower layer LL1 and the second surface S2 of the second lower layer LL2 meet. Therefore, the thickness of the first inorganic layer 310 on the second surface S2 of the second lower layer LL2 may decrease as the distance to the first lower layer LL1 decreases.

The first inorganic layer 310 may have a second thickness d2 on the second surface S2 of the second lower layer LL2. The second thickness d2 may be defined as the length of the first inorganic layer 310 in a direction perpendicular (e.g., substantially perpendicular) to the second surface S2 of the second lower layer LL2. In some embodiments, the second thickness d2 may be defined as an average value of the thicknesses of the first inorganic layer 310 on the second surface S2 of the second lower layer LL2. For example, the second thickness d2 may be a median value of a minimum value among the thicknesses of the first inorganic layer 310 on the second surface S2 of the second lower layer LL2 and a maximum value sdmax among the thicknesses of the first inorganic layer 310 on the second surface S2. The maximum value sdmax may be defined as the thickness of the first inorganic layer 310 in a direction perpendicular (e.g., substantially perpendicular) to the second surface S2 of the second lower layer LL2 at a point at which the first surface S1 and the second surface S2 of the second lower layer LL2 meet.

In an embodiment, the first thickness d1 may be greater than or equal to the second thickness d2. When the first inorganic layer 310 is formed by CVD, the gas forming the first inorganic layer 310 may be more suitably or sufficiently supplied to the first surface S1 of the second lower layer LL2 than the second surface S2 of the second lower layer LL2. Therefore, the first thickness d1 may be greater than or equal to the second thickness d2. In another embodiment, the first thickness d1 may be greater than the second thickness d2. When the first inorganic layer 310 is formed by physical vapor deposition, the first thickness d1 may be greater than the second thickness d2. For example, the first inorganic layer 310 may be formed by sputtering or evaporation. In another embodiment, when the first inorganic layer 310 is formed by atomic layer deposition, the first thickness d1 may be greater than, less than, or equal to the second thickness d2. The following description will focus on a case in which the first inorganic layer 310 is formed by CVD, but the present disclosure is not limited thereto.

The first inorganic layer 310 on the upper surface LLUS of the first lower layer LL1 may have a third thickness d3. In an embodiment, the third thickness d3 may decrease as the distance to the second lower layer LL2 decreases. The first inorganic layer 310 may be formed by CVD. In this case, the first inorganic layer 310 may also be formed on the second surface S2 of the second lower layer LL2. Therefore, the amount of gas forming the first inorganic layer 310 may decrease as the distance to the second lower layer LL2 decreases, and the third thickness d3 may decrease as the distance to the second lower layer LL2 decreases.

A ratio of the second thickness d2 to the first thickness d1 may be about 0.51 or more. In this specification, the ratio of the second thickness d2 to the first thickness d1 may be defined as step coverage. When the ratio of the second thickness d2 to the first thickness d1 is less than 0.51, the first inorganic layer 310 may not suitably or sufficiently cover the lower layer LL. For example, the first inorganic layer 310 may be formed relatively thinly or may not be formed at a point at which the second surface S2 of the second lower layer LL2 and the upper surface LLUS of the first lower layer LL1 meet. In this case, defects such as pinholes may be provided in the first inorganic layer 310, and oxygen, moisture, and/or the like may be transmitted to the organic light-emitting diode through the defects of the first inorganic layer 310. Therefore, dark spots may occur in the display area. When the ratio of the second thickness d2 to the first thickness d1 is 0.51 or more, the first inorganic layer 310 may suitably or sufficiently cover the lower layer LL, thereby improving the reliability of the display device. In some embodiments, the ratio of the second thickness d2 to the first thickness d1 may be about 0.76 or more.

The taper length L may be greater than about 0 µm and less than about 3.6 µm. When the taper length L is 0 µm, the second lower layer LL2 is not defined. When the taper length L is 3.6 µm or more, the first inorganic layer 310 may not suitably or sufficiently cover the second surface S2 of the second lower layer LL2, and defects such as pinholes may form.

Figure 3B:
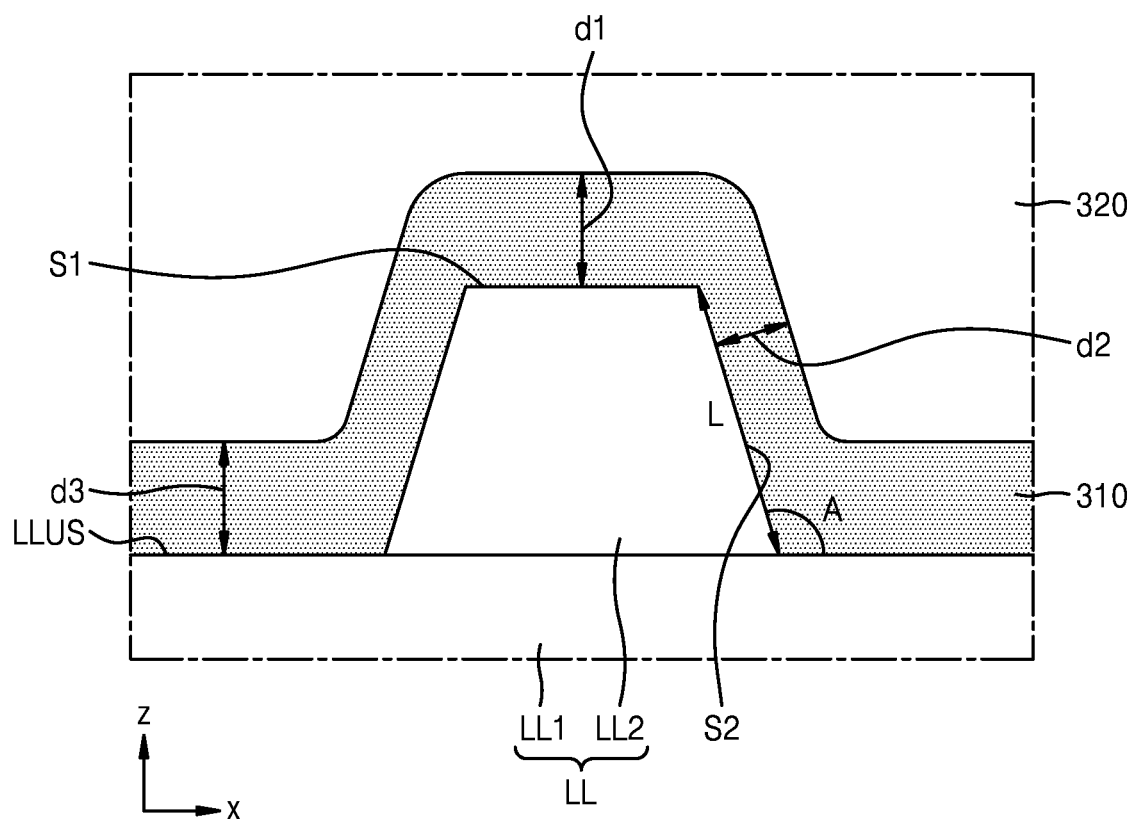
FIG. 3B is a schematic cross-sectional view of a portion of a display device, according to an embodiment.

FIG. 3B is a schematic cross-sectional view of a portion of a display device, according to an embodiment. In FIG. 3B, the same reference numerals as those in FIG. 3A refer to the same members, and redundant descriptions thereof will not be repeated here.

Referring to FIG. 3B, the display device may include a substrate, a display element, a thin-film encapsulation layer, and a lower layer LL. The thin-film encapsulation layer may include at least one inorganic layer and at least one organic layer. In an embodiment, the thin-film encapsulation layer may include a first inorganic layer 310, an organic layer 320, and a second inorganic layer.

The second lower layer LL2 may include a first surface S1 and a second surface S2, and the first surface S1 and the second surface S2 of the second lower layer LL2 may form an angle A therebetween. In this case, the angle A between the first surface S1 and the second surface S2 may be a right angle or an obtuse angle.

The first inorganic layer 310 may cover the first lower layer LL1 and the second lower layer LL2. Also, the organic layer 320 may be on the first inorganic layer 310.

The first inorganic layer 310 may have a first thickness d1 on the first surface S1 of the second lower layer LL2. Also, the first inorganic layer 310 may be on the second surface S2 of the second lower layer LL2. The first inorganic layer 310 may have a second thickness d2 on the second surface S2 of the second lower layer LL2. The second thickness d2 may be defined as the length of the first inorganic layer 310 in a direction perpendicular (e.g., substantially perpendicular) to the second surface S2 of the second lower layer LL2. In some embodiments, the second thickness d2 may be defined as an average value of the thicknesses of the first inorganic layer 310 on the second surface S2 of the second lower layer LL2.

In an embodiment, the first thickness d1 may be greater than or equal to the second thickness d2. In an embodiment, the first inorganic layer 310 may be formed by CVD. When the angle A between the first surface S1 and the second surface S2 of the second lower layer LL2 is a right angle or an obtuse angle, gas forming the first inorganic layer 310 may be suitably or sufficiently supplied to the second surface S2 of the second lower layer LL2. In this case, in some embodiments, the first thickness d1 and the second thickness d2 may be substantially equal to each other. In another embodiment, the first thickness d1 may be greater than the second thickness d2. When the first inorganic layer 310 is formed by physical vapor deposition, the first thickness d1 may be greater than the second thickness d2. For example, the first inorganic layer 310 may be formed by sputtering or evaporation. In another embodiment, when the first inorganic layer 310 is formed by atomic layer deposition, the first thickness d1 may be greater than, less than, or equal to the second thickness d2. The following description will focus on a case in which the first inorganic layer 310 is formed by CVD, but the present disclosure is not limited thereto.

In an embodiment, a third thickness d3 may be equal to the first thickness d1 on the first surface S1 of the second lower layer LL2.

Figure 3C:
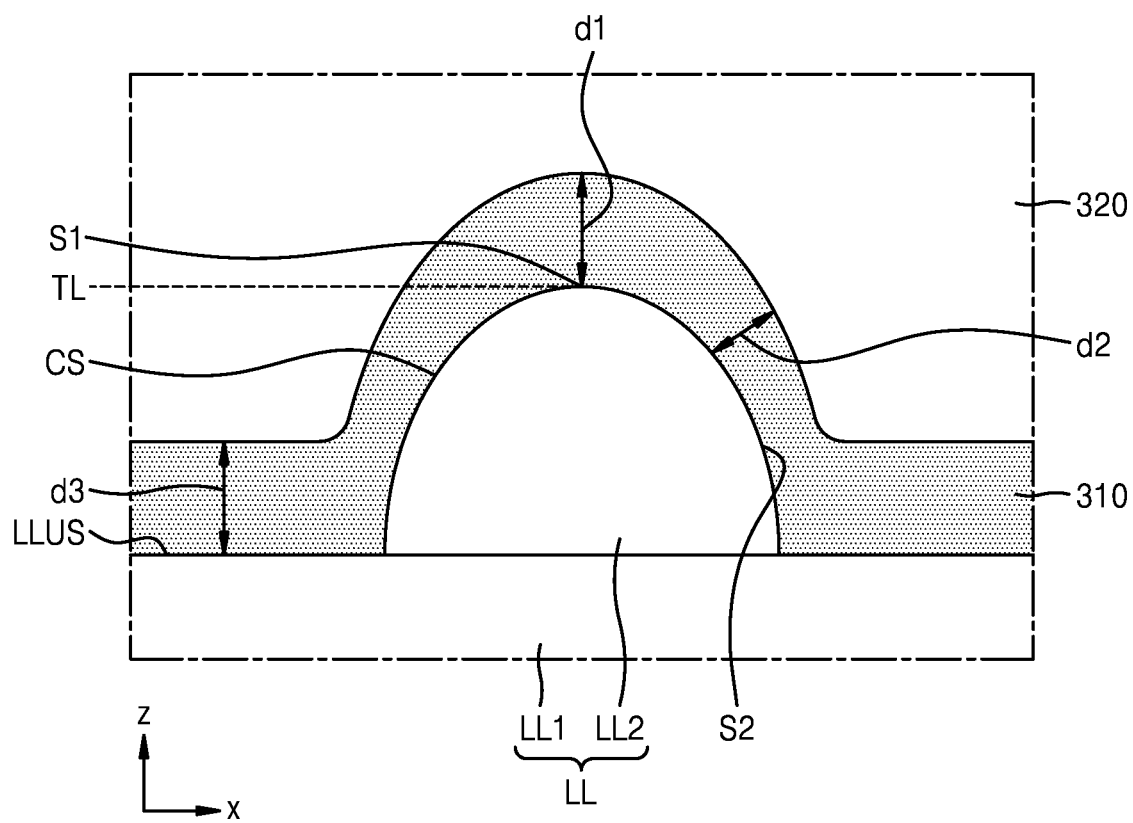
FIG. 3C is a schematic cross-sectional view of a portion of a display device, according to an embodiment.

FIG. 3C is a schematic cross-sectional view of a portion of a display device, according to an embodiment. In FIG. 3C, the same reference numerals as those in FIG. 3A refer to the same members, and redundant descriptions thereof will not be repeated here.

Referring to FIG. 3C, the display device may include a substrate, a display element, a thin-film encapsulation layer, and a lower layer LL. The thin-film encapsulation layer may include at least one inorganic layer and at least one organic layer. In an embodiment, the thin-film encapsulation layer may include a first inorganic layer 310, an organic layer 320, and a second inorganic layer.

The lower layer LL may be below the thin-film encapsulation layer. For example, the lower layer LL may be below the first inorganic layer 310. In this case, the first inorganic layer 310 may be arranged along the shape of the lower layer LL.

The second lower layer LL2 may include a curved surface CS. For example, the second lower layer LL2 may have a semicircle, a half ellipse, or an arc shape. In some embodiments, at least a portion of the second lower layer LL2 may include a curved portion. The curved surface CS of the second lower layer LL2 may include a first surface S1 and a second surface S2. The first surface S1 of the second lower layer LL2 may be defined as an area in which a tangent line TL to the curved surface CS of the second lower layer LL2 extends in a direction parallel (e.g., substantially parallel) to the upper surface of the substrate. In an embodiment, the first surface S1 of the second lower layer LL2 may be defined as any one point. The second surface S2 of the second lower layer LL2 may be defined as an area in which the tangent line TL to the curved surface CS of the second lower layer LL2 extends in a direction crossing (e.g., intersecting with) the upper surface of the substrate. Therefore, the second surface S2 of the second lower layer LL2 may be an area of the second lower layer LL2 excluding the first surface S1 of the second lower layer LL2.

The first inorganic layer 310 may cover the first lower layer LL1 and the second lower layer LL2. Also, the organic layer 320 may be on the first inorganic layer 310.

The first inorganic layer 310 may be on the curved surface CS of the second lower layer LL2. For example, the first inorganic layer 310 may have a first thickness d1 on the first surface S1 of the second lower layer LL2. The first thickness d1 may be defined as the length of the first inorganic layer 310 in a direction normal to the first surface S1 of the second lower layer LL2. For example, the first thickness d1 may be defined as the length of the first inorganic layer 310 in a direction perpendicular (e.g., substantially perpendicular) to the tangent line TL to the curved surface CS of the second lower layer LL2.

The first inorganic layer 310 may have a second thickness d2 on the second surface S2 of the second lower layer LL2. The second thickness d2 may be defined as the length of the first inorganic layer 310 in a direction normal to the second surface S2 of the second lower layer LL2. For example, the second thickness d2 may be defined as an average value of the thicknesses of the first inorganic layer 310 on the second surface S2 of the second lower layer LL2.

In an embodiment, the first thickness d1 may be greater than or equal to the second thickness d2. In some embodiments, the first thickness d1 and the second thickness d2 may be substantially equal to each other. In another embodiment, the first thickness d1 may be greater than the second thickness d2. When the first inorganic layer 310 is formed by physical vapor deposition, the first thickness d1 may be greater than the second thickness d2. For example, the first inorganic layer 310 may be formed by sputtering and/or evaporation (e.g., deposition). In another embodiment, when the first inorganic layer 310 is formed by atomic layer deposition, the first thickness d1 may be greater than, less than, or equal to the second thickness d2. The following description will focus on a case in which the first inorganic layer 310 is formed by CVD, but the present disclosure is not limited thereto. Also, in an embodiment, a third thickness d3 may be equal to the first thickness d1 on the first surface S1 of the second lower layer LL2.

The following description will focus on a case in which the second lower layer LL2 has a polygonal shape, as illustrated in FIGS. 3A and 3B, but the present disclosure is not limited thereto.

Figure 4:
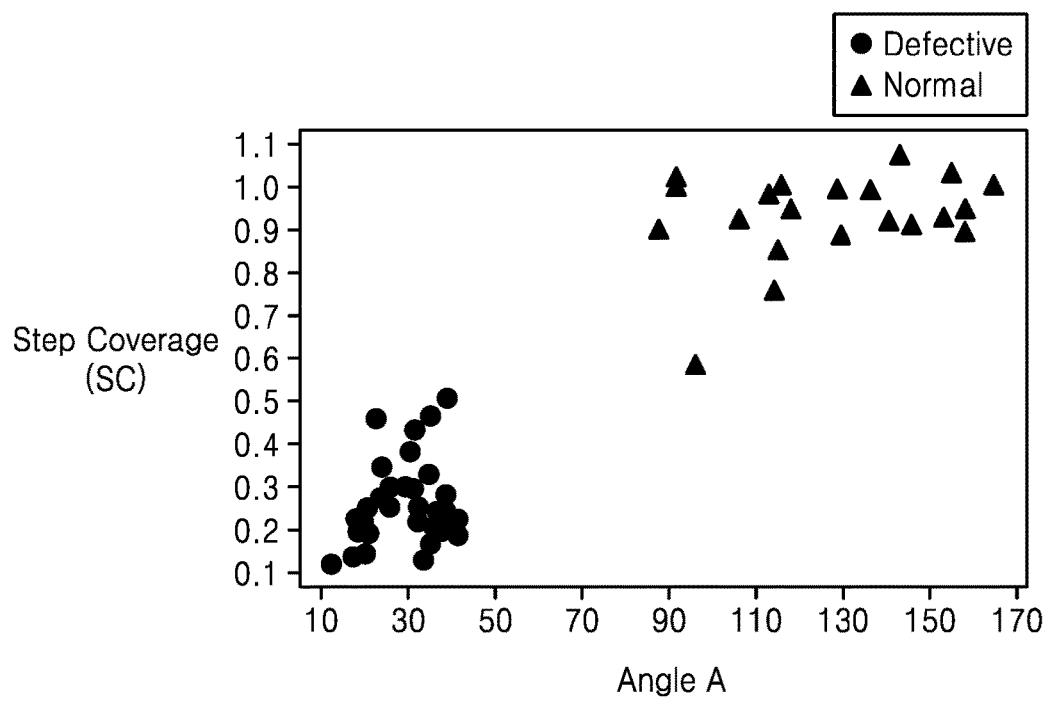
FIG. 4 is a graph showing dark spot defects according to step coverage and an angle between a first surface and a second surface of a second lower layer.

FIG. 4 is a graph showing dark spot defects according to the angle A and the step coverage SC.

Referring to FIG. 4, when the step coverage SC was 0.51 or less, dark spot defects all occurred. Also, when the angle A was 42° or less, dark spot defects all occurred. Therefore, when the step coverage SC is 0.51 or more, the probability of occurrence of dark spot defects may be substantially or significantly reduced and the reliability of the display device may be improved.

Also, when the step coverage SC was 0.76 or more, no dark spot defects occurred. Also, when the angle A was 88° or more, no dark spot defects occurred. Therefore, when the step coverage SC is 0.76 or more, no dark spot defects occur and the reliability of the display device may be improved.

Figure 5A:
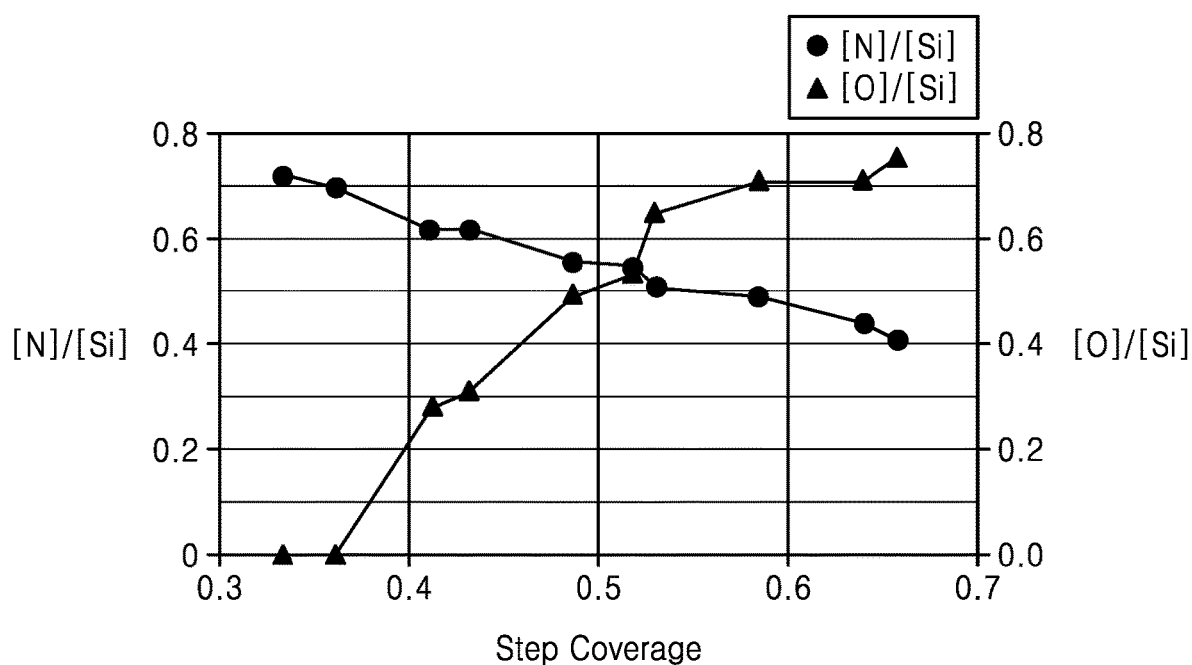
FIG. 5A is a graph showing the composition ratio of an inorganic layer according to step coverage.

FIG. 5A is a graph showing the composition ratio of an inorganic layer according to step coverage.

Referring to FIG. 5A, the inorganic layer may include $Si_xO_YN_Z$. As the step coverage of the inorganic layer increases, a composition ratio (Y/X) of oxygen to silicon in the inorganic layer ($Si_xO_YN_Z$) may increase. For example, when the step coverage of the inorganic layer is greater than 0.41, the composition ratio (Y/X) of oxygen to silicon in the inorganic layer ($Si_xO_YN_Z$) may be greater than about 0.

The composition ratio (Y/X) of oxygen to silicon in the inorganic layer ($Si_xO_YN_Z$) may be greater than about 0.5. When the composition ratio (Y/X) of oxygen to silicon in the inorganic layer ($Si_xO_YN_Z$) is greater than 0.5, the step coverage may be greater than 0.51 and the probability of occurrence of dark spot defects in the display device may be substantially or significantly reduced.

As the step coverage of the inorganic layer increases, a composition ratio (Z/X) of nitrogen to silicon in the inorganic layer ($Si_xO_YN_Z$) may decrease.

The composition ratio (Z/X) of nitrogen to silicon in the inorganic layer ($Si_xO_YN_Z$) may be less than or equal to about 0.5. Also, the composition ratio (Z/X) of nitrogen to silicon in the inorganic layer ($Si_xO_YN_Z$) may be greater than about 0. When the composition ratio (Z/X) of nitrogen to silicon in the inorganic layer ($Si_xO_YN_Z$) is less than or equal to 0.5, the step coverage may be greater than 0.51 and the probability of occurrence of dark spot defects in the display device may be substantially or significantly reduced.

Figure 5B:
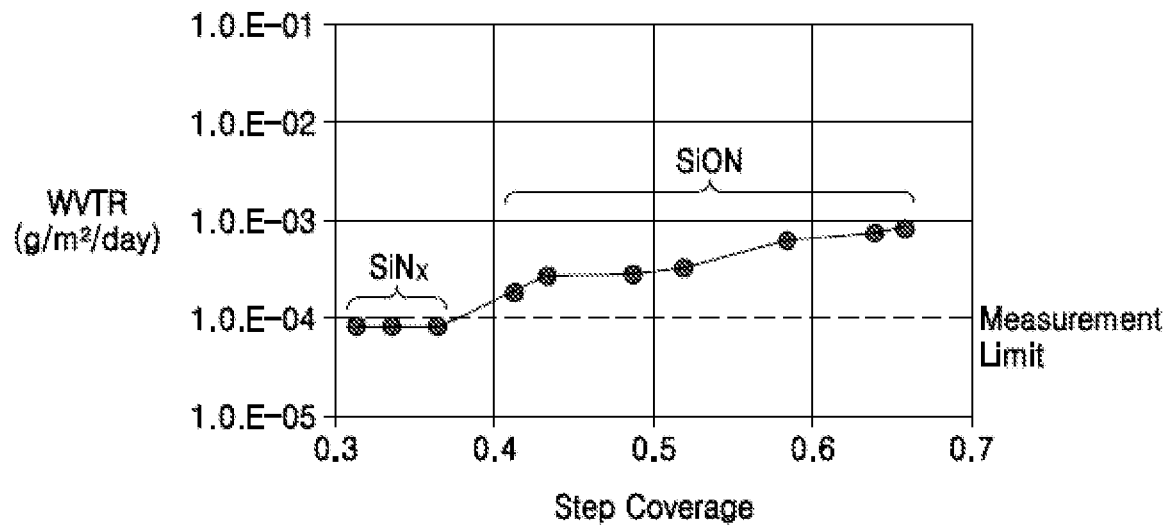
FIG. 5B is a graph showing the water vapor transmission rate (WVTR) of an inorganic layer according to step coverage.

FIG. 5B is a graph of the water vapor transmission rate (WVTR) of an inorganic layer according to step coverage.

Referring to FIG. 5B, as the step coverage of the inorganic layer increases, the WVTR of the inorganic layer may increase. The WVTR refers to the amount of water vapor permeating through the inorganic layer per unit area and unit time.

When the inorganic layer includes silicon oxynitride (SiON), the step coverage may be greater than 0.41 and the WVTR may be greater than 0.0001 g/m²/day. Therefore, when the inorganic layer includes silicon oxynitride (SiON), the step coverage may be improved, but the WVTR may increase, as compared with a case in which the inorganic layer includes silicon nitride ($SiN_x$).

When the inorganic layer includes silicon nitride ($SiN_x$), the step coverage may be less than 0.41 and the WVTR may be less than 0.0001 g/m²/day. FIG. 5B illustrates that the WVTR of silicon nitride ($SiN_x$) is about 0.0001 g/m²/day, but this is due to the measurement limit, and the actual WVTR of silicon nitride ($SiN_x$) may be less than 0.0001 g/m²/day. Therefore, when the inorganic layer includes silicon nitride ($SiN_x$), the WVTR may be low, but the step coverage may decrease, as compared with a case in which the inorganic layer includes silicon oxynitride (SiON).

Figure 5C:
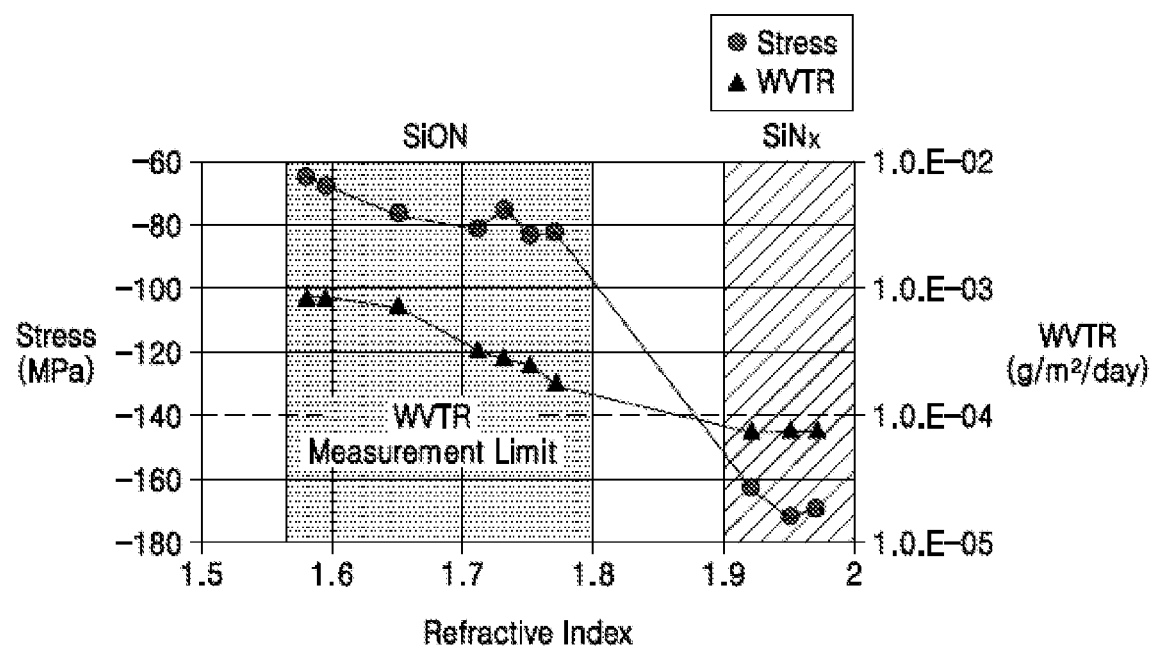
FIG. 5C is a graph showing stress and a WVTR according to the refractive index of an inorganic layer.

FIG. 5C is a graph of stress and a WVTR according to the refractive index of an inorganic layer.

Referring to FIG. 5C, when the inorganic layer includes silicon oxynitride (SiON), the refractive index may be low, as compared with a case in which the inorganic layer includes silicon nitride ($SiN_x$). When the inorganic layer includes silicon oxynitride (SiON), the refractive index of the inorganic layer may be greater than or equal to 1.48 and less than or equal to 1.77. When the inorganic layer includes silicon nitride ($SiN_x$), the refractive index of the inorganic layer may be greater than or equal to 1.92 and less than or equal to 1.97.

As the refractive index of the inorganic layer increases, a magnitude of a stress may increase. The stress described herein represents the magnitude of the force per unit area that the inorganic layer has (or is subjected to), and includes a compressive stress or a tensile stress. In this specification, the compressive stress is expressed as a negative number and the tensile stress is expressed as a positive number. The magnitude of the stress when the inorganic layer includes silicon oxynitride (SiON) may be less than that when the inorganic layer includes silicon nitride ($SiN_x$). The magnitude of the stress, as described herein, means the absolute value of the stress. Therefore, in order to prevent or reduce buckling, a thickness of the inorganic layer when the inorganic layer includes silicon nitride ($SiN_x$) may be less than a thickness of the inorganic layer when the inorganic layer includes silicon oxynitride (SiON). The magnitude of the stress and the refractive index when the inorganic layer includes silicon oxynitride (SiON) may be less than those when the inorganic layer includes silicon nitride ($SiN_x$).

As the refractive index of the inorganic layer increases, the WVTR may decrease. For example, the WVTR when the inorganic layer includes silicon oxynitride (SiON) may be higher than that when the inorganic layer includes silicon nitride (SiNx). Therefore, when the inorganic layer includes silicon oxynitride (SiON), the refractive index may be small and the WVTR may be high, as compared with a case in which the inorganic layer includes silicon nitride (SiNx).

Figure 5D:
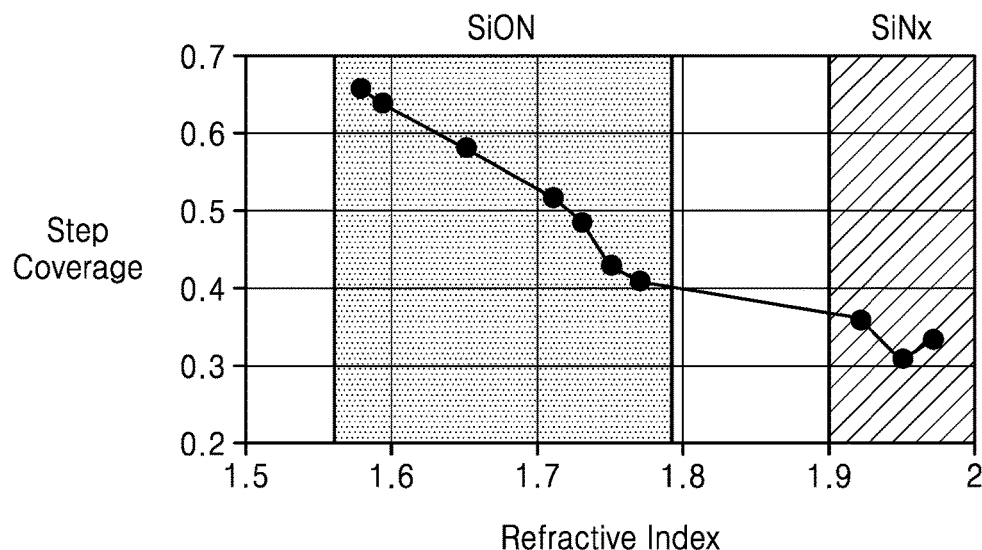
FIG. 5D is a graph showing step coverage according to refractive index.

FIG. 5D is a graph showing step coverage according to refractive index.

Referring to FIG. 5D, as the refractive index of the inorganic layer increases, the step coverage of the inorganic layer may decrease. For example, the refractive index when the inorganic layer includes silicon oxynitride (SiON) may be less than that when the inorganic layer includes silicon nitride ($SiN_x$). Also, the step coverage when the inorganic layer includes silicon oxynitride (SiON) may be greater than the step coverage when the inorganic layer includes silicon nitride ($SiN_x$).

When the inorganic layer includes silicon oxynitride (SiON) and has a refractive index of greater than or equal to 1.48 and less than or equal to 1.71, the step coverage may be greater than 0.51. In this case, the probability of occurrence of dark spot defects in the display device may be substantially or significantly reduced.

Referring to FIGS. 5A to 5D, as the refractive index of the inorganic layer increases, the magnitude of the stress may increase. Also, as the refractive index of the inorganic layer increases, the WVTR may decrease. Furthermore, as the refractive index of the inorganic layer increases, the step coverage may decrease.

Figure 5E:
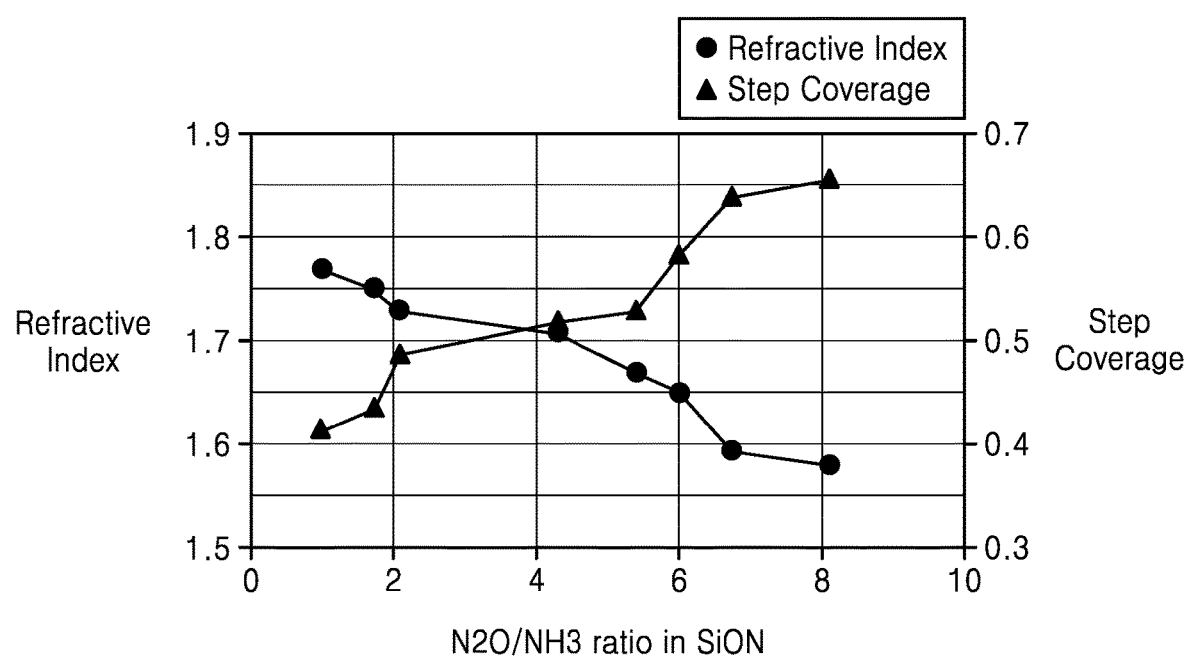
FIG. 5E is a graph showing refractive index and step coverage according to a condition in which an inorganic layer is formed.

FIG. 5E is a graph showing a refractive index and step coverage according to a condition in which an inorganic layer is formed. FIG. 5E illustrates a case in which the inorganic layer includes silicon oxynitride (SiON).

Referring to FIG. 5E, the inorganic layer may be formed by CVD. When the inorganic layer includes silicon oxynitride (SiON), the inorganic layer may be formed using nitrous oxide ($N_2O$) and ammonia ($NH_3$). For example, a display device being manufactured may be charged into a chamber. A concentration of nitrous oxide ($N_2O$) and a concentration of ammonia ($NH_3$) may be set in the chamber. In an embodiment, an oxygen composition ratio of silicon oxynitride (SiON) may increase as the concentration of nitrous oxide ($N_2O$) increases. In an embodiment, an oxygen composition ratio of silicon oxynitride (SiON) may increase as the concentration of ammonia ($NH_3$) increases.

As the concentration of nitrous oxide ($N_2O$) increases compared to the concentration of ammonia ($NH_3$), the step coverage of the inorganic layer may increase. For example, when the concentration of nitrous oxide ($N_2O$) is four or more times higher than the concentration of ammonia ($NH_3$), the step coverage of the inorganic layer may be greater than or equal to 0.51. In this case, the probability of occurrence of dark spot defects in the display device may be substantially or significantly reduced. Also, as the concentration of nitrous oxide ($N_2O$) increases compared to the concentration of ammonia ($NH_3$), the refractive index of the inorganic layer may increase.

Figure 6:
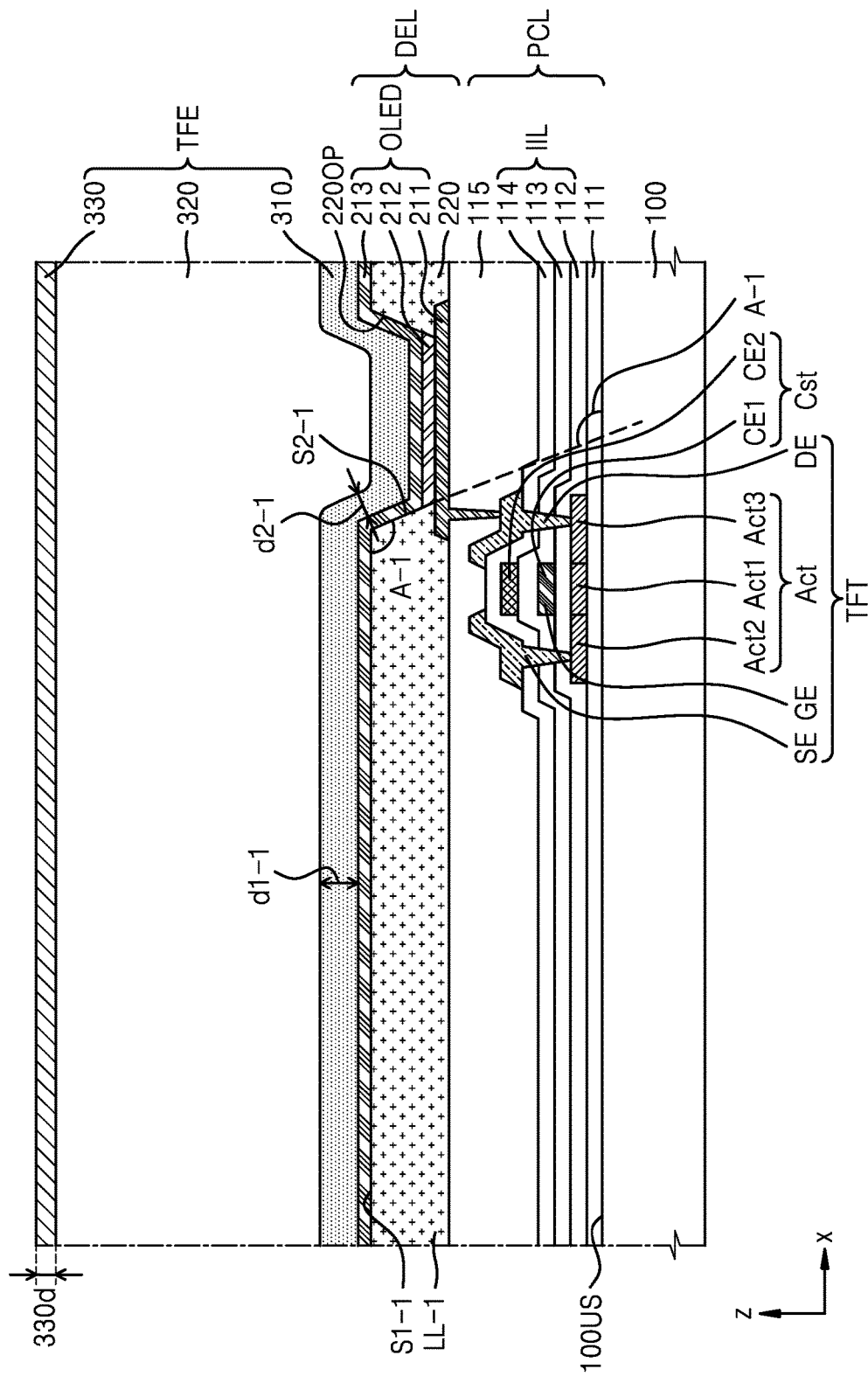
FIG. 6 is a schematic cross-sectional view of a display device according to an embodiment.

FIG. 6 is a schematic cross-sectional view of a display device according to an embodiment. In FIG. 6, the same reference numerals as those in FIG. 2 refer to the same members, and redundant descriptions thereof will not be repeated here.

Referring to FIG. 6, the display device may include a substrate 100, a pixel circuit layer PCL, a display element layer DEL, and a thin-film encapsulation layer TFE. A lower layer LL-1 may be below the thin-film encapsulation layer TFE. The pixel circuit layer PCL may include a buffer layer 111, a thin-film transistor TFT, an inorganic insulating layer IIL, and a planarization layer 115. The inorganic insulating layer IIL may include a first gate insulating layer 112, a second gate insulating layer 113, and an interlayer insulating layer 114. The display element layer DEL may include an organic light-emitting diode OLED. The thin-film encapsulation layer TFE may include a first inorganic layer 310, an organic layer 320, and a second inorganic layer 330.

The buffer layer 111 may be on the substrate 100. The buffer layer 111 may include an inorganic insulating material such as silicon nitride ($SiN_x$), silicon oxynitride (SiON), and silicon oxide ($SiO_2$), and may include a single layer or multiple layers including the above-described inorganic insulating material.

The thin-film transistor TFT may include a semiconductor layer Act, a gate electrode GE, a source electrode SE, and a drain electrode DE. The semiconductor layer Act may include polysilicon, the semiconductor layer Act may include amorphous silicon, semiconductor oxide, and/or organic semiconductor. The semiconductor layer Act may include a channel region Act1, and a source region Act2 and a drain region Act3, which are on both sides of the channel region Act1. The gate electrode GE may overlap the channel region Act1.

The gate electrode GE may include a low resistance metal material. The gate electrode GE may include a conductive material such as molybdenum (Mo), aluminum (Al), copper (Cu), and/or titanium (Ti), and may include a single layer or multiple layers including the above-described material.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the gate electrode GE. Similarly to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

An upper electrode CE2 of a storage capacitor Cst may be above the second gate insulating layer 113. The upper electrode CE2 may overlap the gate electrode GE therebelow. In this case, the gate electrode GE and the upper electrode CE2 overlapping each other with the second gate insulating layer 113 therebetween may form the storage capacitor Cst of a pixel circuit PC. For example, the gate electrode GE may function as a lower electrode CE1 of the storage capacitor Cst.

As such, the storage capacitor Cst may overlap the thin-film transistor TFT. In some embodiments, the storage capacitor Cst may not overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers including the above-described material.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO). The interlayer insulating layer 114 may include a single layer or multiple layers including the above-described inorganic insulating material.

The drain electrode DE and the source electrode SE may be on the interlayer insulating layer 114. The drain electrode DE and the source electrode SE may each include a material having good conductivity (e.g., good electrical conductivity). The drain electrode DE and the source electrode SE may each include a conductive material including molybdenum (Mo), aluminum (Al), copper (Cu), titanium (Ti), and/or the like and may each include a single layer or multiple layers including the above-described material. In an embodiment, the drain electrode DE and the source electrode SE may each have a multiple layer structure of Ti/Al/Ti.

The planarization layer 115 may cover the drain electrode DE and the source electrode SE. The planarization layer 115 may include an organic insulating layer. The planarization layer 115 may include an organic insulating material such as a general-purpose polymer (e.g., polymethylmethacrylate (PMMA), polystyrene (PS), etc.) a polymer derivative having a phenol-based group, an acryl-based polymer, an aryl ether-based polymer, an amide-based polymer, a fluorine-based polymer, a p-xylene-based polymer, a vinyl alcohol-based polymer, and any blend thereof.

The display element layer DEL may be on the pixel circuit layer PCL. The display element layer DEL includes the organic light-emitting diode OLED, and a pixel electrode 211 of the organic light-emitting diode OLED may be electrically coupled to the source electrode SE or the drain electrode DE of the thin-film transistor TFT through a contact hole of the planarization layer 115.

The pixel electrode 211 may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound, alloy, and/or mixture thereof. In another embodiment, the pixel electrode 211 may further include a layer including ITO, IZO, ZnO, and/or $In_2O_3$ above and/or below the reflective layer.

A pixel defining layer 220 having an opening 2200P exposing a central portion of the pixel electrode 211 may be on the pixel electrode 211. The pixel defining layer 220 may include an organic insulating material and/or an inorganic insulating material. The opening 2200P may define an emission area in which light is emitted from the organic light-emitting diode OLED.

An emission layer 212 may be in the opening 2200P of the pixel defining layer 220. The emission layer 212 may include a high molecular weight organic material and/or a low molecular weight organic material, which emits light of a set or certain color.

In some embodiments, a first functional layer and a second functional layer may be below and above the emission layer 212, respectively. For example, the first functional layer may include a hole transport layer (HTL), or may include an HTL and a hole injection layer (HIL). The second functional layer is an optional element on the emission layer 212. The second functional layer may include an electron transport layer (ETL) and/or an electron injection layer (EIL). The first functional layer and/or the second functional layer may be a common layer covering the entire substrate 100, as in an opposite electrode 213 to be further described below.

The opposite electrode 213 may include a conductive (e.g., electrically conductive) material having a relatively low work function. For example, the opposite electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy, mixture, and/or combination thereof. In some embodiments, the opposite electrode 213 may further include a layer such as ITO, IZO, ZnO, or $In_2O_3$ on the (semi)transparent layer including the above-described material.

In some embodiments, a capping layer may be further on the opposite electrodes 213. The capping layer may include LiF, an inorganic material, and/or an organic material.

The thin-film encapsulation layer TFE may be on the opposite electrode 213. In an embodiment, the thin-film encapsulation layer TFE includes at least one inorganic layer and at least one organic layer, and FIG. 6 illustrates that the thin-film encapsulation layer TFE includes the first inorganic layer 310, the organic layer 320, and the second inorganic layer 330, which are sequentially stacked.

The lower layer LL-1 may be below the thin-film encapsulation layer TFE. For example, the lower layer LL-1 may be below the first inorganic layer 310. The lower layer LL-1 may include the pixel defining layer 220. In this case, the first inorganic layer 310 may be arranged along the shape of the pixel defining layer 220.

The lower layer LL-1 may include a first surface S1-1 and a second surface S2-1. The first surface S1-1 of the lower layer LL-1 may be parallel (e.g., substantially parallel) to an upper surface 100US of the substrate 100. In an embodiment, the first surface S1-1 of the lower layer LL-1 may be parallel (e.g., substantially parallel) to the upper surface of the planarization layer 115 or the upper surface of the pixel electrode 211. For example, the first surface S1-1 of the lower layer LL-1 may extend in an x direction.

The lower layer LL-1 may include an inclined second surface S2-1. In an embodiment, the second surface S2-1 of the lower layer LL-1 may define an inner surface of the opening 2200P. The second surface S2-1 of the lower layer LL-1 may extend in a direction crossing (e.g., intersecting with) the upper surface 100US of the substrate 100. For example, the second surface S2-1 of the lower layer LL-1 may extend in a direction crossing (e.g., intersecting with) the first surface S1-1 of the lower layer LL-1. For example, the second surface S2-1 of the lower layer LL-1 may extend in a direction crossing (e.g., intersecting with) the x direction.

The first surface S1-1 and the second surface S2-1 of the lower layer LL-1 may form an angle A-1 therebetween. Because the first surface S1-1 of the lower layer LL-1 extends in a direction parallel (e.g., substantially parallel) to the upper surface 100US of the substrate 100, the angle A-1 may be defined as an angle between the second surface S2-1 of the lower layer LL-1 and the upper surface 100US of the substrate 100.

In an embodiment, the angle A-1 between the first surface S1-1 and the second surface S2-1 of the lower layer LL-1 may be an obtuse angle or a right angle. In an embodiment, the angle A-1 between the first surface S1-1 and the second surface S2-1 of the lower layer LL-1 may be an acute angle.

The first inorganic layer 310 may be on the curved lower layer LL-1. For example, the first inorganic layer 310 may cover the first surface S1-1 and the second surface S2-1 of the lower layer LL-1. In this case, the first inorganic layer 310 may have a first thickness d1-1 on the first surface S1-1 of the lower layer LL-1. The first thickness d1-1 may be defined as the length of the first inorganic layer 310 in a direction perpendicular (e.g., substantially perpendicular) to the first surface S1 of the lower layer LL-1. In some embodiments, the first thickness d1-1 may be defined as the length of the first inorganic layer 310 in a direction perpendicular (e.g., substantially perpendicular) to the upper surface 100US of the substrate 100.

The first inorganic layer 310 may have a second thickness d2-1 on the second surface S2-1 of the lower layer LL-1. The second thickness d2-1 may be defined as the length of the first inorganic layer 310 in a direction perpendicular (e.g., substantially perpendicular) to the second surface S2-1 of the lower layer LL-1. For example, the second thickness d2-1 may be defined as an average value of the thicknesses of the first inorganic layer 310 on the second surface S2-1 of the lower layer LL-1.

In an embodiment, the first thickness d1-1 may be greater than or equal to the second thickness d2-1. When the first inorganic layer 310 is formed by CVD, the first thickness d1-1 may be greater than or equal to the second thickness d2-1. In some embodiments, the first thickness d1-1 and the second thickness d2-1 may be substantially equal to each other. In another embodiment, the first thickness d1-1 may be greater than the second thickness d2-1. When the first inorganic layer 310 is formed by physical vapor deposition, the first thickness d1-1 may be greater than the second thickness d2-1. In another embodiment, the first thickness d1-1 may be greater than, less than, or equal to the second thickness d2-1. When the first inorganic layer 310 is formed by atomic layer deposition, the first thickness d1-1 may be greater than, less than, or equal to the second thickness d2-1.

A ratio of the second thickness d2-1 to the first thickness d1-1 may be about 0.51 or more. For example, the step coverage may be about 0.51 or more. In some embodiments, the ratio of the second thickness d2-1 to the first thickness d1-1 may be about 0.76 or more. Therefore, the first inorganic layer 310 may suitably or sufficiently cover the pixel defining layer 220 and the organic light-emitting diode OLED, and the reliability of the display device may be improved.

In an embodiment, the first inorganic layer 310 may include silicon oxynitride (SiON). When the first inorganic layer 310 includes silicon oxynitride (SiON) and a composition ratio of oxygen to silicon is greater than 0.5, the step coverage of the first inorganic layer 310 may be 0.51 or more. Therefore, the reliability of the display device may be improved.

The refractive index of the first inorganic layer 310 may be lower than the refractive index of the second inorganic layer 330. Also, the refractive index of the organic layer 320 may be lower than the refractive index of the second inorganic layer 330. The first inorganic layer 310 is a layer closest to the organic light-emitting diode OLED in the thin-film encapsulation layer TFE. When the refractive index of the first inorganic layer 310 is relatively lower than the refractive index of the second inorganic layer 330, the extraction efficiency of light emitted from the organic light-emitting diode OLED may be improved. Also, when the refractive index of the first inorganic layer 310 is relatively lower than the refractive index of the second inorganic layer 330, the white angle difference (WAD) of light emitted from the organic light-emitting diode OLED may be improved. Also, when the light absorption coefficient of the first inorganic layer 310 is low, the extraction efficiency of light emitted from the organic light-emitting diode OLED may be improved. When the first inorganic layer 310 includes silicon oxynitride (SiON), the first inorganic layer 310 has a relatively smaller refractive index and a smaller light absorption coefficient than those when the first inorganic layer 310 includes silicon nitride ($SiN_x$). Therefore, the extraction efficiency of light emitted from the organic light-emitting diode OLED may be improved.

The organic layer 320 may be on the first inorganic layer 310 and may cover the first inorganic layer 310. In this case, the upper surface of the organic layer 320 may be flat.

The second inorganic layer 330 may be on the organic layer 320. The second inorganic layer 330 may be on the flat upper surface of the organic layer 320. Therefore, the step coverage of the second inorganic layer 330 may be less important than the step coverage of the first inorganic layer 310.

In an embodiment, the second inorganic layer 330 may include silicon nitride ($SiN_x$). Therefore, the WVTR of the second inorganic layer 330 may be less than the WVTR of the first inorganic layer 310, and the second inorganic layer 330 may function as a barrier layer.

As such, the first inorganic layer 310 and the second inorganic layer 330 may include different materials from each other. For example, the first inorganic layer 310 may include silicon oxynitride (SiON) so as to have relatively high step coverage, and the second inorganic layer 330 may include silicon nitride ($SiN_x$) so as to have a relatively low WVTR. Therefore, the reliability of the display device may be improved.

A thickness 330d of the second inorganic layer 330 may be less than a first thickness d1-1 of the first inorganic layer 310. When the second inorganic layer 330 includes a material having a low WVTR, the stress of the second inorganic layer 330 may be higher than the stress of the first inorganic layer 310. Therefore, a buckling phenomenon may occur in the second inorganic layer 330, as compared with the first inorganic layer 310. In this case, because the thickness 330d of the second inorganic layer 330 is less than the first thickness d1-1 of the first inorganic layer 310, occurrence of a buckling phenomenon may be prevented or reduced.

In some embodiments, a touch electrode layer may be on the thin-film encapsulation layer TFE, and an optical functional layer may be on the touch electrode layer. The touch electrode layer may obtain coordinate information according to an external input, for example, a touch event. The optical functional layer may reduce reflectance of light (external light) incident from the outside toward the display device, and/or may improve color purity of light emitted from the display device. In an embodiment, the optical functional layer may include a retarder and/or a polarizer. The retarder may be a film type retarder (e.g., a film kind of retarder) or a liquid crystal coating type retarder (e.g., a liquid crystal coating kind of retarder) and may include a λ/2 retarder and/or a λ/4 retarder. The polarizer may also be a film type polarizer (e.g., a film kind of polarizer) or a liquid crystal coating type polarizer (e.g., a liquid crystal coating kind of polarizer). The film type polarizer (e.g., the film kind of polarizer) may include a stretched synthetic resin film, and the liquid crystal coating type polarizer (e.g., the liquid crystal coating kind of polarizer) may include liquid crystals arranged in a set or certain array. The retarder and the polarizer may each further include a protective film.

In another embodiment, the optical functional layer may include a black matrix and color filters. The color filters may be arranged considering the color of light emitted from each pixel of the display device. The color filters may each include a red, green, and/or blue pigment and/or dye. In some embodiments, the color filters may each further include, in addition to the pigment or dye, quantum dots. In some embodiments, some color filters may not include the pigment or dye and may include scattering particles such as titanium oxide.

In another embodiment, the optical functional layer may include a destructive interference structure. The destructive interference structure may include a first reflective layer and a second reflective layer, which are on different layers from each other. First reflected light and second reflected light respectively reflected from the first reflective layer and the second reflective layer may destructively interfere with each other, and thus, the reflectance of external light may be reduced.

An adhesive member may be between the touch electrode layer and the optical functional layer. The adhesive member may be employed without being limited to those commonly used in the art. The adhesive member may include a pressure sensitive adhesive (PSA).

Figure 7:
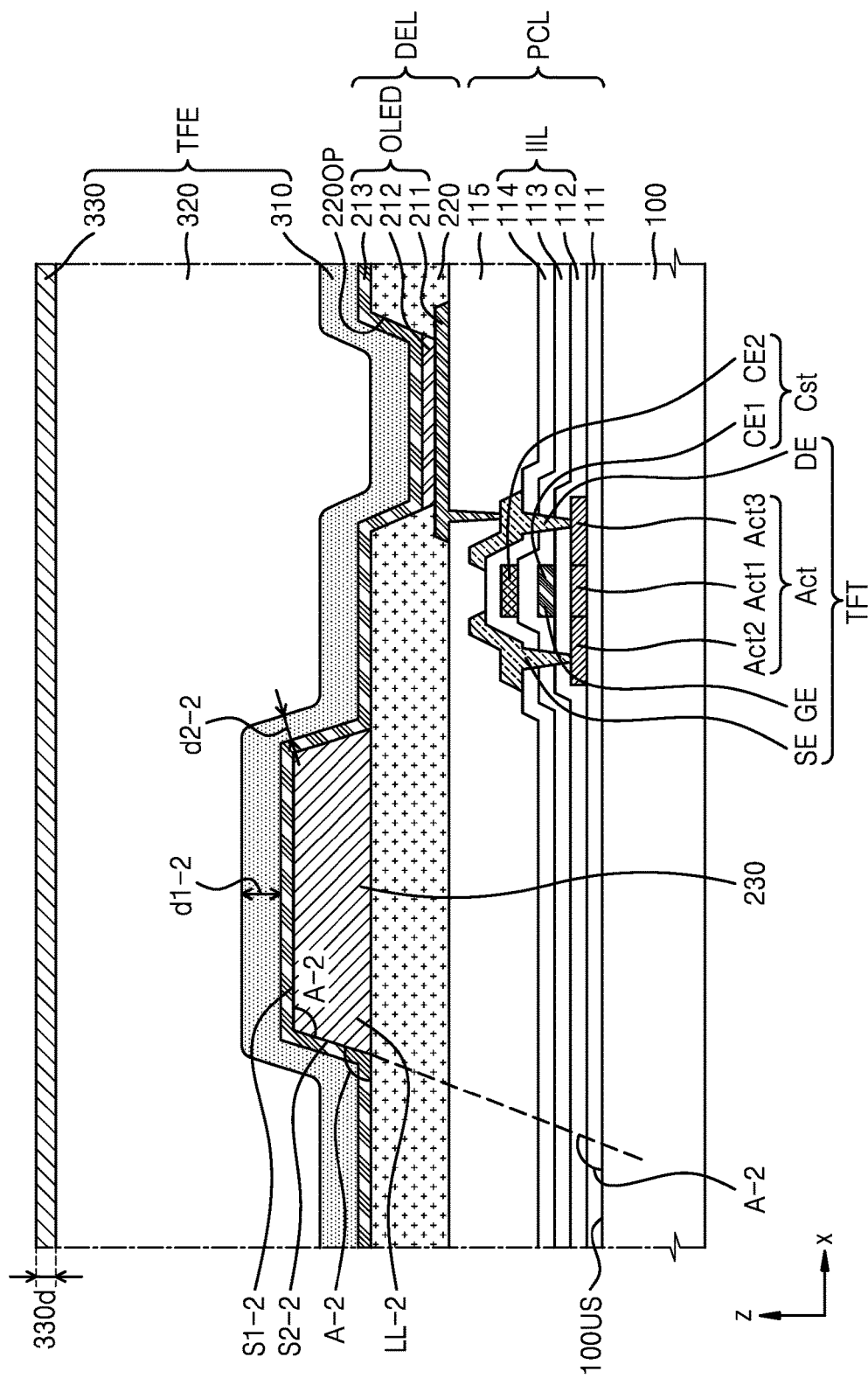
FIG. 7 is a schematic cross-sectional view of a display device according to an embodiment.

FIG. 7 is a schematic cross-sectional view of a display device according to an embodiment. In FIG. 7, the same reference numerals as those in FIG. 6 refer to the same members, and redundant descriptions thereof will not be repeated here.

Referring to FIG. 7, the display device may include a substrate 100, a pixel circuit layer PCL, a display element layer DEL, and a thin-film encapsulation layer TFE. A lower layer LL-2 may be below the thin-film encapsulation layer TFE. The pixel circuit layer PCL may include a buffer layer 111, a thin-film transistor TFT, an inorganic insulating layer IIL, and a planarization layer 115. The inorganic insulating layer IIL may include a first gate insulating layer 112, a second gate insulating layer 113, and an interlayer insulating layer 114. The display element layer DEL may include an organic light-emitting diode OLED. The thin-film encapsulation layer TFE may include a first inorganic layer 310, an organic layer 320, and a second inorganic layer 330.

The lower layer LL-2 may be below an opposite electrode 213 and the thin-film encapsulation layer TFE. For example, the lower layer LL-2 may be below the opposite electrode 213 and the first inorganic layer 310. The lower layer LL-2 may include a spacer 230. The spacer 230 may be on a pixel defining layer 220. The spacer 230 may prevent or reduce damage to at least one of the substrate 100, the pixel circuit layer PCL, and the display element layer DEL in a method of manufacturing the display device. In a method of manufacturing an organic light-emitting diode OLED, a mask sheet may be used. At least one of the substrate 100, the pixel circuit layer PCL, and the display element layer DEL may be damaged by the mask sheet. When an emission layer 212 is formed, the spacer 230 may separate the mask sheet from at least one of the substrate 100, the pixel circuit layer PCL, and the display element layer DEL. Therefore, the spacer 230 may prevent or reduce breakage or damage to at least one of the substrate 100, the pixel circuit layer PCL, and the display element layer DEL.

The spacer 230 may include an organic material such as polyimide. In some embodiments, the spacer 230 may include an inorganic insulating material such as silicon nitride ($SiN_x$) or silicon oxide ($SiO_2$) or may include an organic insulating material and an inorganic insulating material.

In an embodiment, the spacer 230 may include a material different from that of the pixel defining layer 220. In another embodiment, the spacer 230 may include the same (e.g., substantially the same) material as that of the pixel defining layer 220. In this case, the pixel defining layer 220 and the spacer 230 may be formed together in a mask process using a halftone mask and/or the like.

The lower layer LL-2 may include a first surface S1-2 and a second surface S2-2. The first surface S1-2 of the lower layer LL-2 may be parallel (e.g., substantially parallel) to an upper surface 100US of the substrate 100. In an embodiment, the first surface S1-2 of the lower layer LL-2 may be parallel (e.g., substantially parallel) to the upper surface of the pixel electrode 221. For example, the first surface S1-2 of the lower layer LL-2 may extend in an x direction.

The lower layer LL-2 may include an inclined second surface S2-2. The second surface S2-2 of the lower layer LL-2 may extend in a direction crossing (e.g., intersecting with) the upper surface 100US of the substrate 100. For example, the second surface S2-2 of the lower layer LL-2 may extend in a direction crossing (e.g., intersecting with) the first surface S1-2 of the lower layer LL-2. For example, the second surface S2-2 of the lower layer LL-2 may extend in a direction crossing (e.g., intersecting with) the x direction.

The first surface S1-2 and the second surface S2-2 of the lower layer LL-2 may form an angle A-2 therebetween. Because the first surface S1-2 of the lower layer LL-2 extends in a direction parallel (e.g., substantially parallel) to the upper surface 100US of the substrate 100, the angle A-2 may be defined as an angle between the second surface S2-2 of the lower layer LL-2 and the upper surface 100US of the substrate 100.

In an embodiment, the angle A-2 between the first surface S1-2 and the second surface S2-2 of the lower layer LL-2 may be an obtuse angle or a right angle. In an embodiment, the angle A-2 between the first surface S1-2 and the second surface S2-2 of the lower layer LL-2 may be an acute angle.

The first inorganic layer 310 may cover the first surface S1-2 and the second surface S2-2 of the lower layer LL-2. In this case, the first inorganic layer 310 may have a first thickness d1-2 on the first surface S1-2 of the lower layer LL-2. The first thickness d1-2 may be defined as the length of the first inorganic layer 310 in a direction perpendicular (e.g., substantially perpendicular) to the first surface S1-2 of the lower layer LL-2. In some embodiments, the first thickness d1-2 may be defined as the length of the first inorganic layer 310 in a direction perpendicular (e.g., substantially perpendicular) to the upper surface 100US of the substrate 100.

The first inorganic layer 310 may have a second thickness d2-2 on the second surface S2-2 of the lower layer LL-2. The second thickness d2-2 may be defined as the length of the first inorganic layer 310 in a direction perpendicular (e.g., substantially perpendicular) to the second surface S2-2 of the lower layer LL-2. For example, the second thickness d2-2 may be defined as an average value of the thicknesses of the first inorganic layer 310 on the second surface S2-2 of the lower layer LL-2.

In an embodiment, the first thickness d1-2 may be greater than or equal to the second thickness d2-2. When the first inorganic layer 310 is formed by physical vapor deposition, the first thickness d1-2 may be greater than or equal to the second thickness d2-2. In some embodiments, the first thickness d1-2 and the second thickness d2-2 may be substantially equal to each other. In another embodiment, the first thickness d1-2 may be greater than the second thickness d2-2. When the first inorganic layer 310 is formed by physical vapor deposition, the first thickness d1-2 may be greater than the second thickness d2-2. In another embodiment, the first thickness d1-2 may be greater than, less than, or equal to the second thickness d2-2. When the first inorganic layer 310 is formed by atomic layer deposition, the first thickness d1-2 may be greater than, less than, or equal to the second thickness d2-2.

A ratio of the second thickness d2-2 to the first thickness d1-2 may be about 0.51 or more. For example, the step coverage may be about 0.51 or more. In some embodiments, the ratio of the second thickness d2-2 to the first thickness d1-2 may be about 0.76 or more. Therefore, the first inorganic layer 310 may suitably or sufficiently cover the pixel defining layer 220, the spacer 230, and the organic light-emitting diode OLED, and the reliability of the display device may be improved.

Figure 8:
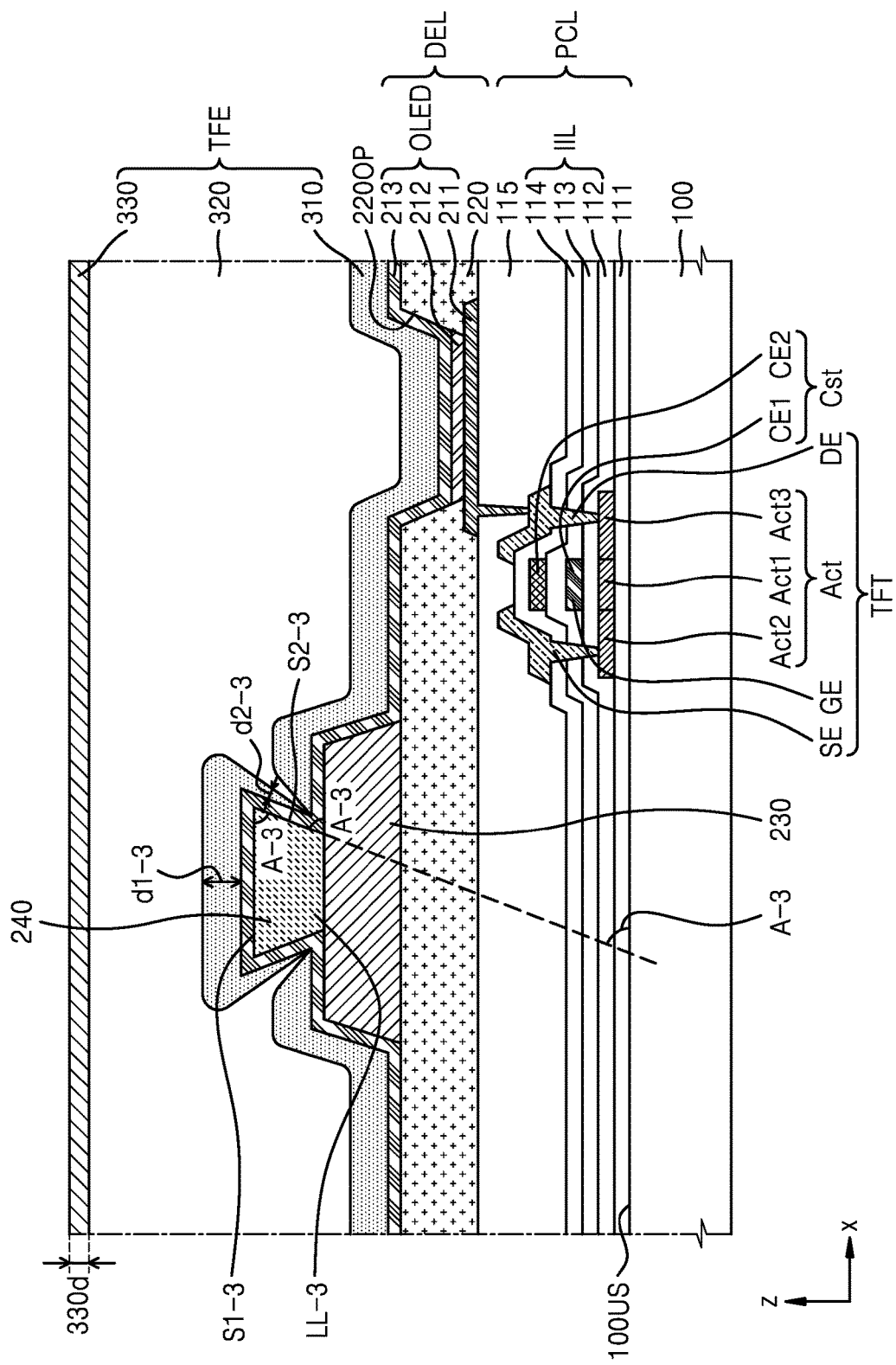
FIG. 8 is a schematic cross-sectional view of a display device according to an embodiment.

FIG. 8 is a schematic cross-sectional view of a display device according to an embodiment. In FIG. 8, the same reference numerals as those in FIG. 7 refer to the same members, and redundant descriptions thereof will not be repeated here.

Referring to FIG. 8, the display device may include a substrate 100, a pixel circuit layer PCL, a display element layer DEL, and a thin-film encapsulation layer TFE. A lower layer LL-3 may be below the thin-film encapsulation layer TFE. The pixel circuit layer PCL may include a buffer layer 111, a thin-film transistor TFT, an inorganic insulating layer IIL, and a planarization layer 115. The inorganic insulating layer IIL may include a first gate insulating layer 112, a second gate insulating layer 113, and an interlayer insulating layer 114. The display element layer DEL may include an organic light-emitting diode OLED. The thin-film encapsulation layer TFE may include a first inorganic layer 310, an organic layer 320, and a second inorganic layer 330.

The lower layer LL-3 may be below an opposite electrode 213 and the thin-film encapsulation layer TFE. For example, the lower layer LL-3 may be below the opposite electrode 213 and the first inorganic layer 310. The lower layer LL-3 may be on a spacer 230. In an embodiment, the lower layer LL-3 may include a pattern layer 240. The pattern layer 240 may include the same (e.g., substantially the same) material as that of an emission layer 212. In a method of manufacturing an organic light-emitting diode OLED, a mask sheet may be used to form the emission layer 212. At this time, the mask sheet may be reused, and the material forming the emission layer may remain in the reused mask sheet. In this case, when the mask sheet is close to the spacer 230, the pattern layer 240 may be formed on the spacer 230 by the material.

The lower layer LL-3 may include a first surface S1-3 and a second surface S2-3. In an embodiment, the first surface S1-3 of the lower layer LL-3 may be parallel (e.g., substantially parallel) to an upper surface 100US of the substrate 100. In an embodiment, the first surface S1-3 of the lower layer LL-3 may be parallel (e.g., substantially parallel) to the upper surface of the spacer 230. For example, the first surface S1-3 of the lower layer LL-3 may extend in an x direction. In an embodiment, the first surface S1-3 of the lower layer LL-3 may meet the second surface S2-3 of the lower layer LL-3 and crossing (e.g., intersect with) the second surface S2-3 of the lower layer LL-3.

The lower layer LL-3 may include an inclined second surface S2-3. The second surface S2-3 of the lower layer LL-3 may extend in a direction crossing (e.g., intersecting with) the upper surface 100US of the substrate 100. For example, the second surface S2-3 of the lower layer LL-3 may extend in a direction crossing (e.g., intersecting with) the first surface S1-3 of the lower layer LL-3. For example, the second surface S2-3 of the lower layer LL-3 may extend in a direction crossing (e.g., intersecting with) the x direction.

The first surface S1-3 and the second surface S2-3 of the lower layer LL-3 may form an angle A-3 therebetween. Because the first surface S1-3 of the lower layer LL-3 extends in a direction parallel (e.g., substantially parallel) to the upper surface 100US of the substrate 100, the angle A-3 may be defined as an angle between the second surface S2-3 of the lower layer LL-3 and the upper surface 100US of the substrate 100. In some embodiments, the angle A-3 may be defined as an angle between the upper surface of the spacer 230 and the second surface S2-3 of the lower layer LL-3.

In an embodiment, the angle A-3 between the first surface S1-3 and the second surface S2-3 of the lower layer LL-3 may be an acute angle. In an embodiment, the angle A-3 between the first surface S1-3 and the second surface S2-3 of the lower layer LL-3 may be an obtuse angle or a right angle. For example, the angle A-3 between the first surface S1-3 and the second surface S2-3 of the lower layer LL-3 may be 42° or more. In another example, the angle A-3 between the first surface S1-3 and the second surface S2-3 of the lower layer LL-3 may be 88° or more.

The first inorganic layer 310 may cover the first surface S1-3 and the second surface S2-3 of the lower layer LL-3. In this case, the first inorganic layer 310 may have a first thickness d1-3 on the first surface S1-3 of the lower layer LL-3. The first thickness d1-3 may be defined as the length of the first inorganic layer 310 in a direction perpendicular (e.g., substantially perpendicular) to the first surface S1-3 of the lower layer LL-3. In some embodiments, the first thickness d1-3 may be defined as the length of the first inorganic layer 310 in a direction perpendicular (e.g., substantially perpendicular) to the upper surface 100US of the substrate 100.

The first inorganic layer 310 may have a second thickness d2-3 on the second surface S2-3 of the lower layer LL-3. The second thickness d2-3 may be defined as the length of the first inorganic layer 310 in a direction perpendicular (e.g., substantially perpendicular) to the second surface S2-3 of the lower layer LL-3. For example, the second thickness d2-3 may be defined as an average value of the thicknesses of the first inorganic layer 310 on the second surface S2-3 of the lower layer LL-3.

In an embodiment, the first thickness d1-3 may be greater than or equal to the second thickness d2-3. When the angle A-3 between the first surface S1-3 and the second surface S2-3 of the lower layer LL-3 is an acute angle and the first inorganic layer 310 is formed by CVD, gas forming the first inorganic layer 310 may be more suitably or sufficiently supplied to the first surface S1-3 of the lower layer LL-3 than the second surface S2-3 of the lower layer LL-3. Therefore, the first thickness d1-3 may be greater than or equal to the second thickness d2-3. In some embodiments, the first thickness d1-3 may be less than the second thickness d2-3. In another embodiment, the first thickness d1-3 may be greater than the second thickness d2-3. When the first inorganic layer 310 is formed by physical vapor deposition, the first thickness d1-3 may be greater than the second thickness d2-3. In another embodiment, the first thickness d1-3 may be greater than, less than, or equal to the second thickness d2-3. When the first inorganic layer 310 is formed by atomic layer deposition, the first thickness d1-3 may be greater than, less than, or equal to the second thickness d2-3.

A ratio of the second thickness d2-3 to the first thickness d1-3 may be about 0.51 or more. For example, the step coverage may be about 0.51 or more. In some embodiments, the ratio of the second thickness d2-3 to the first thickness d1-3 may be about 0.76 or more. Therefore, the first inorganic layer 310 may suitably or sufficiently cover the pixel defining layer 220, the spacer 230, the pattern layer 240, and the organic light-emitting diode OLED, and the reliability of the display device may be improved.

As described above, one or more embodiments may include a thin-film encapsulation layer including at least one inorganic layer and at least one organic layer. In this case, because a ratio of a second thickness to a first thickness of the at least one inorganic layer is about 0.51 or more, a defect rate of display devices may be substantially or significantly reduced. Therefore, the reliability of display devices may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A display device comprising:
a substrate;
a display element on the substrate, the display element comprising a pixel electrode and an opposite electrode opposite to the pixel electrode;
a pixel defining layer covering an edge of the pixel electrode and having an opening exposing a central portion of the pixel electrode;
a spacer above the pixel defining layer;
a thin-film encapsulation layer on the display element, the thin-film encapsulation layer comprising at least one inorganic layer and at least one organic layer; and
a pattern layer between the thin-film encapsulation layer and the spacer, the pattern layer comprising a bottom surface contacting an upper surface of the spacer, a first surface opposite to the bottom surface, and an inclined second surface connecting the bottom surface and the first surface,
wherein the opposite electrode continuously covers the first surface of the pattern layer and the inclined second surface of the pattern layer, and
wherein the at least one inorganic layer has a first thickness on the first surface of the pattern layer and a second thickness on the inclined second surface of the pattern layer,
the first thickness is greater than or equal to the second thickness, and a ratio of the second thickness to the first thickness is about 0.51 or more,
wherein a width of the inclined second surface of the pattern layer increases from the bottom surface to the first surface of the pattern layer, and
wherein a width of the bottom surface of the pattern layer is smaller than a width of the upper surface of the spacer.

2. The display device of claim 1, wherein the ratio of the second thickness to the first thickness is about 0.76 or more.

3. The display device of claim 1, wherein the at least one inorganic layer comprises $Si_XO_YN_Z$,
a composition ratio (Y/X) of oxygen to silicon in the at least one inorganic layer ($Si_XO_YN_Z$) is greater than about 0.5, and
a composition ratio (Z/X) of nitrogen to silicon in the at least one inorganic layer ($Si_XO_YN_Z$) is less than or equal to about 0.5.

4. The display device of claim 1, wherein the thin-film encapsulation layer comprises a first inorganic layer, an organic layer, and a second inorganic layer, which are sequentially stacked,
the first inorganic layer is arranged along the first surface and the inclined second surface of the pattern layer, and
a thickness of the second inorganic layer is less than a thickness of the first inorganic layer.

5. The display device of claim 4, wherein a water vapor transmission rate (WVTR) of the second inorganic layer is less than a WVTR of the first inorganic layer.

6. The display device of claim 4, wherein the first inorganic layer comprises silicon oxynitride (SiON), and
the second inorganic layer comprises silicon nitride ($SiN_x$).

7. A display device comprising:
a substrate;
a display element on the substrate, the display element comprising a pixel electrode and an opposite electrode opposite to the pixel electrode;
a pixel defining layer covering an edge of the pixel electrode and having an opening exposing a central portion of the pixel electrode;
a spacer above the pixel defining layer;
a thin-film encapsulation layer on the display element, the thin-film encapsulation layer comprising a first inorganic layer, an organic layer, and a second inorganic layer, which are sequentially stacked; and
a pattern layer between the first inorganic layer and the spacer, the pattern layer comprising a bottom surface contacting an upper surface of the spacer, a first surface opposite to the bottom surface, and an inclined second surface connecting the bottom surface and the first surface,
wherein the opposite electrode continuously covers the first surface of the pattern layer and the inclined second surface of the pattern layer, and
wherein the first inorganic layer has a first thickness on the first surface of the pattern layer and a second thickness on the inclined second surface of the pattern layer,
the first thickness is greater than or equal to a thickness of the second inorganic layer, and a ratio of the second thickness to the first thickness is about 0.51 or more,
wherein a width of the inclined second surface of the pattern layer increases from the bottom surface to the first surface of the pattern layer, and
wherein a width of the bottom surface of the pattern layer is smaller than a width of the upper surface of the spacer.

8. The display device of claim 7, wherein the ratio of the second thickness to the first thickness is about 0.76 or more.

9. The display device of claim 7, wherein the first inorganic layer comprises $Si_XO_YN_Z$,
a composition ratio (Y/X) of oxygen to silicon in the first inorganic layer ($Si_XO_YN_Z$) is greater than about 0.5, and
a composition ratio (Z/X) of nitrogen to silicon in the first inorganic layer ($Si_XO_YN_Z$) is less than or equal to about 0.5.

10. The display device of claim 7, wherein a water vapor transmission rate (WVTR) of the second inorganic layer is less than a WVTR of the first inorganic layer.

11. The display device of claim 7, wherein a refractive index of the second inorganic layer is greater than a refractive index of the first inorganic layer.

12. The display device of claim 1, wherein
the display element further comprises an emission layer between the pixel electrode and the opposite electrode, and
the pattern layer comprises a same material as the emission layer.

13. The display device of claim 7, wherein
the display element further comprises an emission layer between the pixel electrode and the opposite electrode, and the pattern layer comprises a same material as the emission layer.

\* \* \* \* \*